United States Patent
Ido

(10) Patent No.: US 7,495,955 B2
(45) Date of Patent: Feb. 24, 2009

(54) NONVOLATIVE SEMICONDUCTOR MEMORY DEVICE AND OPERATING METHOD THEREOF

(75) Inventor: Masamiti Ido, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/640,486

(22) Filed: Dec. 18, 2006

(65) Prior Publication Data
US 2007/0140003 A1    Jun. 21, 2007

(30) Foreign Application Priority Data

Dec. 19, 2005  (JP) .............................. 2005-365308
Dec. 12, 2006  (JP) .............................. 2006-335118

(51) Int. Cl.
*G11C 16/04*    (2006.01)

(52) U.S. Cl. ........................... 365/185.02; 365/185.21; 365/185.23; 365/185.2; 365/189.04

(58) Field of Classification Search ............ 365/185.02, 365/185.21, 185.23, 185.2, 189.14
See application file for complete search history.

(56) References Cited

U.S. PATENT DOCUMENTS

2005/0285301 A1*  12/2005  Mochizuki .............. 365/185.17

FOREIGN PATENT DOCUMENTS

JP        2004-055081 A      2/2004

* cited by examiner

*Primary Examiner*—Thong Q Le
(74) *Attorney, Agent, or Firm*—Foley & Lardner LLP

(57) ABSTRACT

A nonvolatile semiconductor memory device includes a plurality of nonvolatile memory cells for a user area and a trimming data storage area; and a plurality of word lines. A first trimming data is stored in the trimming data storage area, and is for adjusting a read voltage to be applied to a selected word line as one of the plurality of word lines in a read operation. The read voltage is set to a voltage which exceeds a maximum voltage in an adjustable voltage range based on the first trimming data when the read operation is carried out to the trimming data storage area.

16 Claims, 19 Drawing Sheets

NONVOLATIVE SEMICONDUCTOR MEMORY DEVICE AND OPERATING METHOD THEREOF

BACKGROUND OF THE INVENTION

1. Field of the Invention

The present invention relates to a nonvolatile semiconductor memory device and an operating method thereof, in particular, a nonvolatile semiconductor memory device using a trimming technique and an operating method thereof.

2. Description of the Related Art

In recent years, with miniaturization of the size of a nonvolatile semiconductor memory device, ON-current in a memory cell has been decreased. As the ON-state current is decreased, manufacture variations in a word line voltage and sense amplifier reference current greatly influence on relative relation between the ON-current and the sense amplifier reference current. In such a case, when data in the memory cell is read on the basis of the sense amplifier reference current and the ON-current, the read operation may become unstable.

For the above situation, a trimming scheme (disclosed in, for example, Japanese Laid Open Patent Application (JP-P2004-55081A)) is employed of suppressing the variations in the word line voltage and the sense amplifier reference current in the read operation, in order to properly read data with the reduced ON-current. According to the trimming scheme, first, a wafer test is carried out and then optimum trimming data is determined for each chip of the nonvolatile memory. The determined trimming data is stored in a dedicated memory array area in the nonvolatile memory (hereinafter, referred to as a "trimming data storage area"). Next, in a system initial operation (hereinafter, referred to as a "reset sequence"), the trimming data is read out from the trimming data storage area to set optimum word line voltage and sense amplifier reference current (or reference voltage). Thus, in the subsequent system operation, the read operation can be carried out in the optimum state.

Here, a conventional nonvolatile semiconductor memory device described in Japanese Laid Open Patent Application (JP-P2004-55081A) will be described. FIG. 1 is a block diagram of a conventional nonvolatile semiconductor memory device. The conventional nonvolatile semiconductor memory device has a nonvolatile memory array 101, a plurality of trimming circuits 108 to 111, a decoder circuit 105, a trimming register 106 and a selector circuit 107. Data can be electrically written or erased into or from the nonvolatile memory array 101. The nonvolatile memory array 101 is divided into a user area 102 and a trimming data storage area 103. The user area 102 stores user data therein. The trimming data storage area 103 stores trimming data corresponding to each of operation modes. The plurality of trimming circuits 108 to 111 carries out trimming operations in accordance with each operation mode. The decoder circuit 105 receives a mode signal and designates an address in the nonvolatile memory array 101 in which the trimming data is stored for the operation mode represented by the mode signal. The trimming register 106 stores the trimming data read out from the nonvolatile memory array 101 according to the address designated by the decoder circuit 105. The selector circuit 107 outputs the trimming data held in the trimming register 106 to one of the trimming circuits 108 to 111 corresponding to the operation mode represented by the mode signal.

FIG. 2 is a circuit diagram showing a part of configuration of the nonvolatile memory array 101. The nonvolatile memory array 101 (the user area 102 and the trimming data storage area 103) has a plurality of word lines WL, a plurality of source lines SL, a plurality of bit lines BL, and a plurality of memory cells M. The plurality of memory cells M are nonvolatile memory cells such as flash memory cells. The word lines WL and the source lines SL extend in a first direction and are connected to control gates and sources of corresponding memory cells M, respectively. Each of the bit lines BL extends in a second direction substantially orthogonal to the first direction and is connected to drains of corresponding memory cells M. The memory cells M are provided at intersection points of the word lines WL and the bit lines BL. When a memory cell M11 is selected from the memory cells M, a word line WL3 is selected from the word lines WL, a bit lines BL0 is selected from the bit lines BL and a source line SL1 is selected from the source lines SL.

For example, in FIG. 2, when data is read from the memory cell M11 as the selected cell, a read voltage $V_{read}$ (word line voltage) is applied to the word line WL3 connected to the control gate of the selected cell M11 and the other word lines WL are set to the ground voltage. A predetermined read voltage is applied to the bit line BL0 connected to the drain of the selected cell M11 and the other bit lines BL are set to the ground voltage. All source lines SL are set to the ground voltage. At this time, data in the memory cell M11 is read by comparing a cell current $I_{on}$ passing through the memory cell M11 and the bit lines BL with a reference current $I_{REF}$ in a sense amplifier circuit 4.

Next, a read operation of reading out data from the memory cells M of the nonvolatile memory array 101 will be described. Here, for an ON-state memory cell as a selected cell in a first state where a threshold voltage is low (data "0" has been written) and an OFF-state memory cell as a selected cell in a second state where the threshold voltage is high (data "1" has been written), relationship between current and voltage at the read operation will be described. FIG. 3 is a graph showing relationship between the read voltage and cell currents and the sense amplifier reference current. A horizontal axis represents a read voltage $V_{read}$ (word line voltage) and a vertical axis represents cell current $I_{on}$ and the sense amplifier reference current $I_{REF}$. The sense amplifier reference current $I_{REF}$ passes through the sense amplifier (not shown in FIG. 1) in the read operation. The sense amplifier compares the sense amplifier reference current $I_{REF}$ with the cell current $I_{on}$ to read data. The ON-state memory cell current $I_{on1}$ as the cell current $I_{on}$ passes through the ON-state memory cell. The ON-state memory cell current $I_{on1}$ rapidly increases with increase in the word line voltage. On the other hand, The OFF-state memory cell current $I_{on2}$ as the cell current $I_{on}$ passes through the OFF-state memory cell. The OFF-state memory cell current $I_{on2}$ increases slightly with increase in the word line voltage. The sense amplifier reference current $I_{REF}$ is set constant irrespective of the word line voltage. The read voltage (word line voltage) $V_{read}$ applied to the word lines is set to be $V_0$ (for example, 2.5 V). The ON-state memory cell is determined to be in the first state based on the ON-state memory cell current $I_{on1}$ larger than the sense amplifier reference current $I_{REF}$. On the other hand, the OFF-state memory cell is determined to be in the second state based on the OFF-state memory cell current $I_{on2}$ smaller than the sense amplifier reference current $I_{REF}$.

Here, unless both the ON-state memory cell current $I_{on1}$ and the OFF-state memory cell current $I_{on2}$ have a certain margin with respect to the sense amplifier reference current $I_{REF}$ in case of the read voltage $V_{read} = V_0$, an operation speed, that is, a read speed of the sense amplifier is decreased. For this reason, the sense amplifier is generally used in the condition that an ON margin $\Delta I_{m1}$ (for example, 5 μA) and an OFF margin $\Delta I_{m2}$ (for example, 5 μA) are ensured. At this time, when there are variations in the word line voltage and the sense amplifier reference current in terms of manufacture yield, since the ON-current (ON-state memory cell current $I_{on1}$) is small, influence of the variations is considered to be large. That is, it is expected that the margins (the ON margin $\Delta I_{m1}$ and the OFF margin $\Delta I_{m2}$) cannot sufficiently ensured due to small variations. However, even in this case, since the variations are suppressed by adjusting the word line voltage and the sense amplifier reference current on the basis of the trimming data (TCD, TCD2) to ensure sufficient margins, a proper read operation can be carried out without decreasing the read speed.

However, the trimming data is read out from the trimming data storage area before the word line voltage and the sense amplifier reference current are optimized. In other words, in the read operation of the trimming data from the trimming data storage area 103 during the reset sequence, optimum trimming data cannot be found. For this reason, there is a possibility that the variation in the sense amplifier reference current $I_{REF}$ becomes large. FIG. 4 is a graph showing a relationship between the read voltage, the cell currents and the sense amplifier reference current. A horizontal axis represents the read voltage $V_{read}$ (word line voltage) and a vertical axis represents the cell current $I_{on}$ and the sense amplifier reference current $I_{REF}$. FIG. 4 shows a state that the sense amplifier reference current $I_{REF}$ is shifted relatively greatly due to variation in the sense amplifier reference current $I_{REF}$ (or variation in the ON-state memory cell current $I_{on1}$). In case of the read voltage (word line voltage) $V_{read}=V_0$, the ON margin $\Delta I_{m1}$ between the ON-state memory cell current $I_{on1}$ and the sense amplifier reference current $I_{REF}$ becomes about 0 µA and the margin cannot be ensured. This leads a problem that the sense amplifier cannot read correctly data in the ON-state memory cell in the trimming data storage area 103. That is, there is a case where the trimming data cannot be correctly read. Therefore, a method capable of correctly reading the trimming data in the reset sequence before reading the trimming data, even when the ON-state current is small is strongly demanded.

SUMMARY OF THE INVENTION

In an aspect of the present invention, a nonvolatile semiconductor memory device includes a plurality of nonvolatile memory cells for a user area and a trimming data storage area; and a plurality of word lines. A first trimming data is stored in the trimming data storage area, and is for adjusting a read voltage to be applied to a selected word line as one of the plurality of word lines in a read operation. The read voltage is set to a voltage which exceeds a maximum voltage in an adjustable voltage range based on the first trimming data when the read operation is carried out to the trimming data storage area.

Also, in another aspect of the present invention, a nonvolatile semiconductor memory device includes a memory cell array having a plurality of nonvolatile memory cells; a sense amplifier circuit configured to read a data from a selected memory cell which is selected from the plurality of nonvolatile memory cells based on a cell current and a reference current; wherein the cell current flows through the selected memory cell and a bit line which is connected with the selected memory cell, based on a read voltage applied to a word line connected with the selected memory cell; and a read voltage generating circuit configured to generate a first read voltage such that the cell current becomes larger than in a read operation from any of nonvolatile memory cells, in which a trimming data is not stored, of the plurality of nonvolatile memory cells, when the trimming data is read from the nonvolatile memory cells, in which the trimming data is stored, of the plurality of nonvolatile memory cells.

Also, another aspect of the present invention relates to an operation method of a nonvolatile semiconductor memory device, which has a plurality of nonvolatile memory cells for a user area and a trimming data storage area, and a plurality of word lines, includes a first trimming data is stored in the trimming data storage area to adjust a read voltage to be applied to a selected word line of the plurality of word lines in a read operation. The operation method is achieved by setting the read voltage to a voltage which exceeds a maximum voltage in an adjustable voltage range based on the first trimming data when the read operation is carried out to the trimming data storage area; and by applying the read voltage to the selected word line and executing the read operation to the trimming data storage area.

Also, another aspect of the present invention relates to an operation method of a nonvolatile semiconductor memory device, which comprises a cell array containing a plurality of nonvolatile memory cells, a sense amplifier configured to read a data from a selected memory cell selected from the plurality of nonvolatile memory cells based on a cell current and a reference current, wherein the cell current flows through a bit line connected with the selected memory cell and the selected memory cell based on the read voltage applied to the word line which connected with the selected memory cell, and a read voltage generating circuit configured to generate the read voltage. The operation method is achieved by generating a first read voltage such that the cell current becomes larger than in the read operation from the selected memory cell, in which the trimming data is not stored, from the plurality of nonvolatile memory cells, when the read voltage generating circuit reads the trimming data from the selected memory cells, in which the trimming data are stored, from the plurality of nonvolatile memory cells; and by the sense amplifier reading the trimming data from the selected memory cells based on the cell current and the reference current.

Also, in another aspect of the present invention, a microcomputer includes a storage unit configured to store a program; a central processing unit (CPU) configured to execute the program; and a nonvolatile semiconductor memory. The nonvolatile semiconductor memory includes a plurality of nonvolatile memory cells for a user area and a trimming data storage area; and a plurality of word lines. A first trimming data is stored in the trimming data storage area, and is for adjusting a read voltage to be applied to a selected word line as one of the plurality of word lines in a read operation. The read voltage is set to a voltage which exceeds a maximum voltage in an adjustable voltage range based on the first trimming data when the read operation is carried out to the trimming data storage area.

According to the present invention, a nonvolatile semiconductor memory device capable of correctly reading the trimming data in the reset sequence even when the reference current is shifted can be obtained.

DESCRIPTION OF THE PREFERRED EMBODIMENTS

Hereinafter, a nonvolatile semiconductor memory device, an operating method thereof and a microcomputer in which the nonvolatile semiconductor memory device is incorporated, according to the present invention will be described with reference to the attached drawings.

First Embodiment

Figure 5:
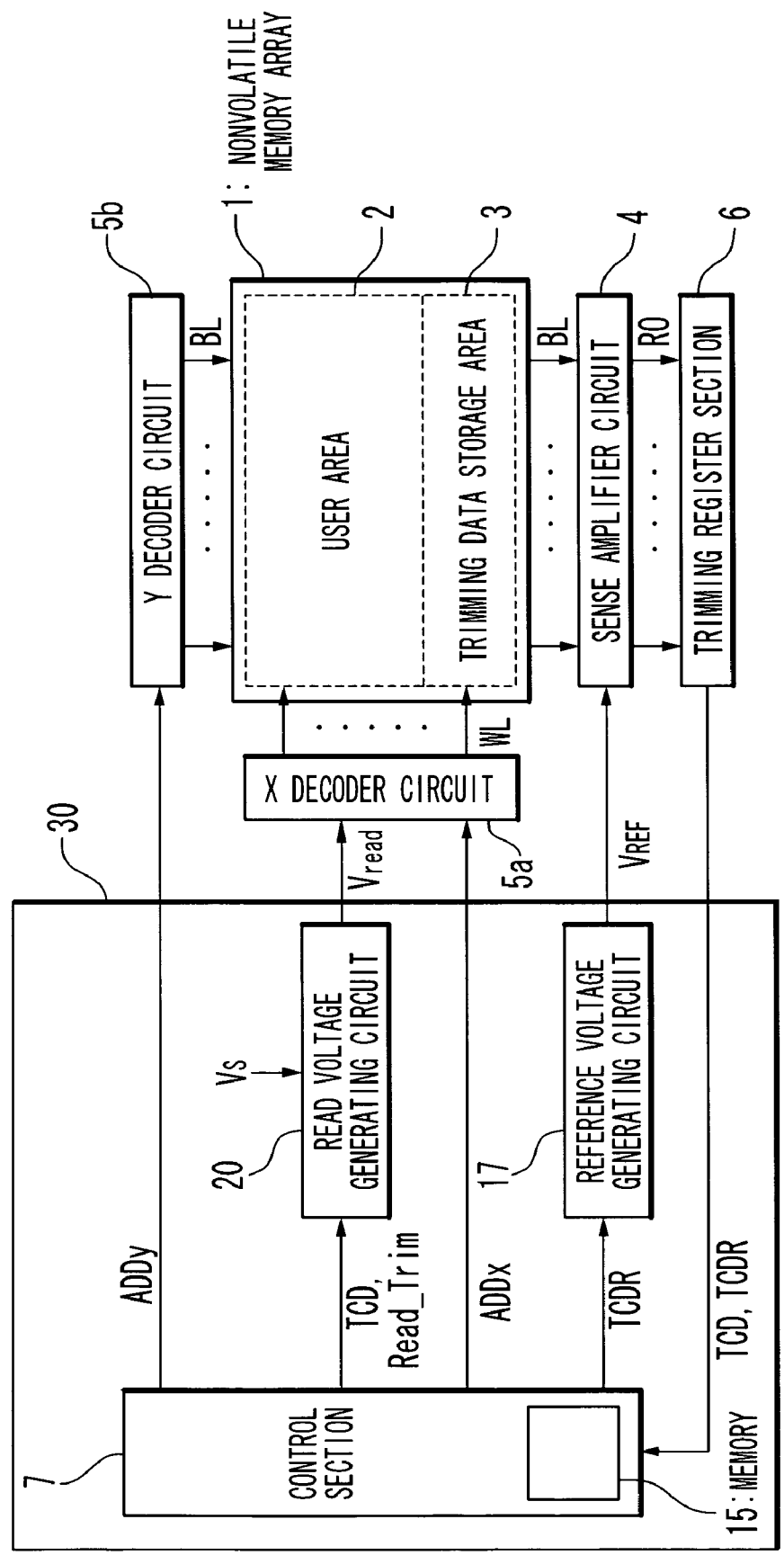
FIG. 5 is a block diagram showing a configuration of a nonvolatile semiconductor memory device according to a first embodiment of the present invention.

First, the nonvolatile semiconductor memory device according to the first embodiment of the present invention will be described. FIG. 5 is a block diagram showing a configuration of the nonvolatile semiconductor memory device according to the first embodiment of the present invention. A nonvolatile semiconductor memory device 10 has a memory array 1, a sense amplifier circuit 4, a trimming register 6, an X decoder circuit 5a, a Y decoder circuit 5b, a control unit 7, a reference voltage generating circuit 17 and a read voltage generating circuit 20.

Figure 1:
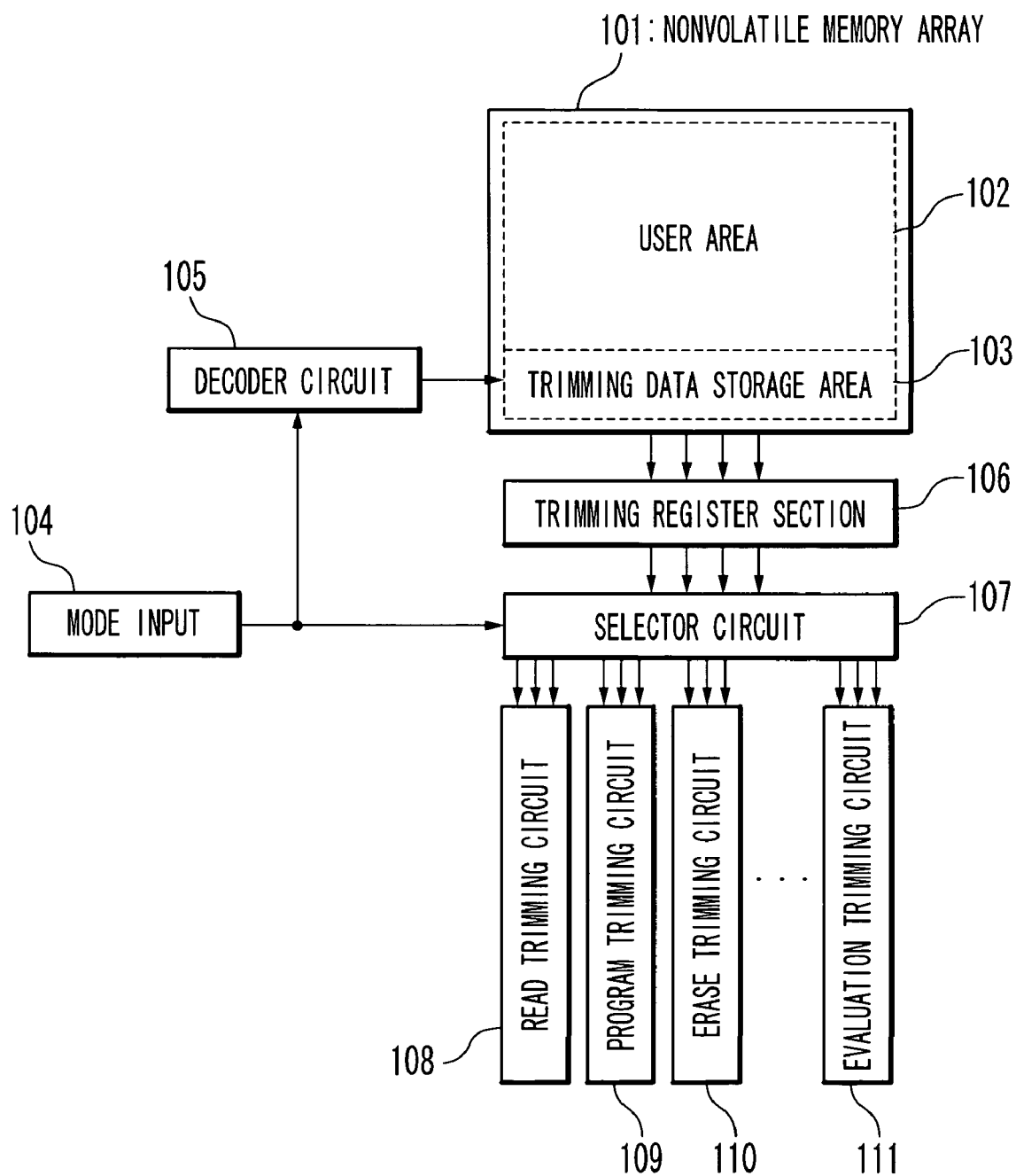
FIG. 1 is a block diagram showing a configuration of a conventional nonvolatile memory.
Figure 2:
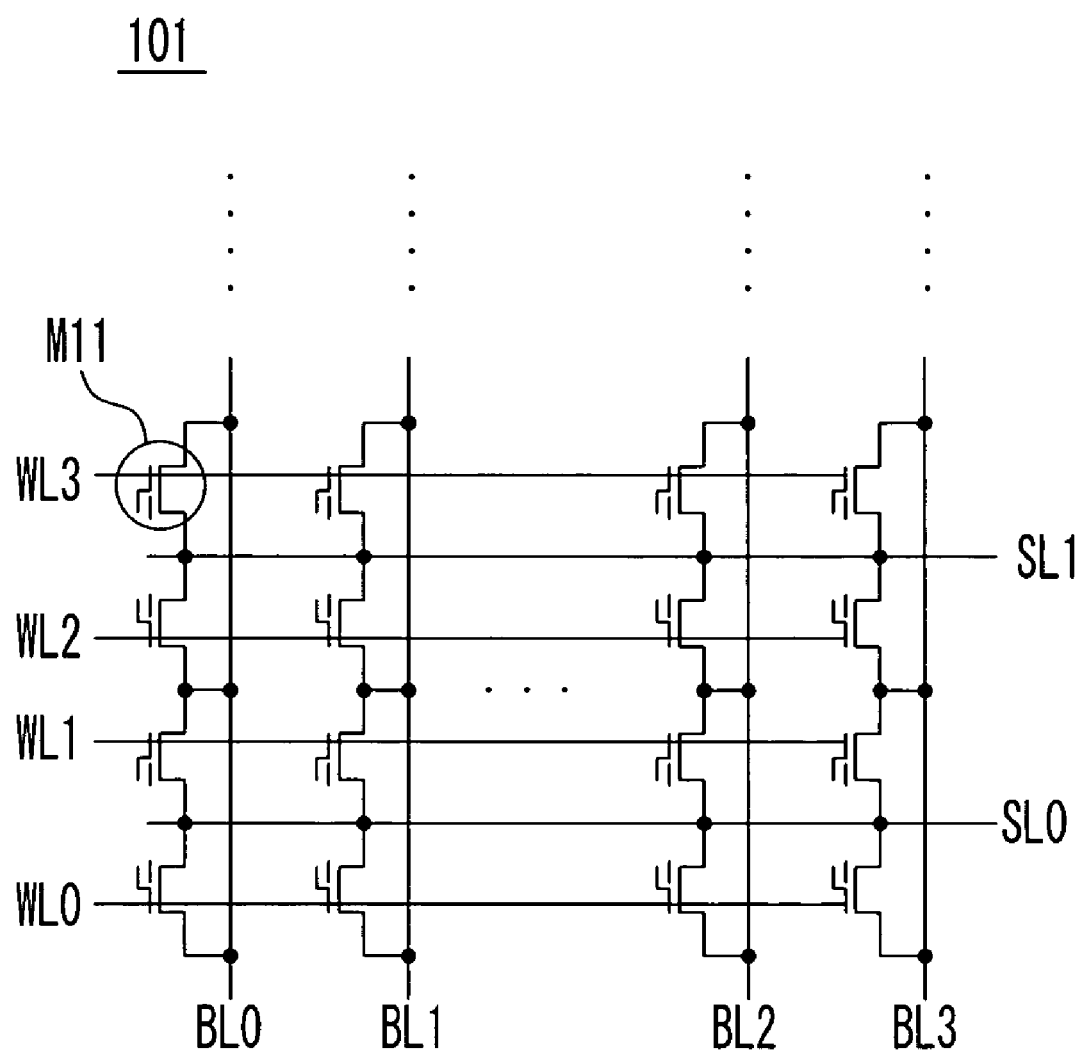
FIG. 2 is a circuit diagram showing a configuration of a part of a nonvolatile memory array in the conventional nonvolatile memory.

The memory array 1 has a plurality of word lines WL, a plurality of source lines SL, a plurality of bit lines BL and a plurality of memory cells. The memory cells are nonvolatile memory cells such as flash memory cells. The memory array 1 is divided into a user area 2 and a trimming data storage area 3. The user area 2 is used to store a user data. The trimming data storage area 3 is used to store data to be read in a reset sequence such as trimming data corresponding to each of operation modes. Since a circuit diagram showing a part of the configuration of the memory array 1 is the same as FIG. 2, description thereof is omitted.

The control unit 7 has a memory 15. The memory 15 stores address data ADD (ADDX, ADDy) of the trimming data storage area 3 therein. The memory 15 is a ROM, for example. The control unit 7 is set in the reset sequence, to output a trimming data TCD for read (reset sequence) and a trimming read signal Read_Trim to the read voltage generating circuit 20 and respectively output the address data ADDX and ADDy to the X decoder circuit 5a and Y decoder circuit 5b. In addition, after the read operation of the trimming data, the control unit 7 is set to receive the trimming data from the trimming register 6, to output new trimming data TCD to the read voltage generating circuit 20 and to output the trimming data TCDR to the reference voltage generating circuit 17. The control unit 7 further controls operations of the other components.

The reference voltage generating circuit 17 generates a reference voltage $V_{REF}$ on the basis of the trimming data TCDR and outputs the generated voltage to the sense amplifier circuit 4. In absence of the trimming data TCDR, the reference voltage generating circuit 17 generates a default reference voltage $V_{REF}$ and outputs the generated voltage. The read voltage generating circuit 20 generates a read voltage $V_{read}$ on the basis of a reference voltage $V_s$ and the trimming data TCD and outputs the generated voltage to the X decoder circuit 5a. In absence of the trimming data TCDR, the reference voltage generating circuit 17 generates a default read voltage $V_{read}$ and outputs the generated voltage. The X decoder circuit 5a selects one word line from the plurality of word lines WL of the memory array 1 on the basis of the address data ADDx. Then, the read voltage $V_{read}$ is applied to the selected word line. The Y decoder circuit 5b selects one bit line from the plurality of bit lines BL of the memory array 1 on the basis of the address data ADDy. Based on the selected word line and the selected bit line, one memory cell is selected from the plurality of memory cells. The sense amplifier circuit 4 is a group of sense amplifiers for 32 bits. The sense amplifier circuit 4 reads data stored in the selected memory cell on the basis of the reference current $I_{REF}$ generated on the basis of the reference voltage $V_{REF}$ and the current passing through the selected bit line according to the voltage applied to the selected memory cell. The trimming register 6 latches and saves the trimming data during the system operation.

Figure 6:
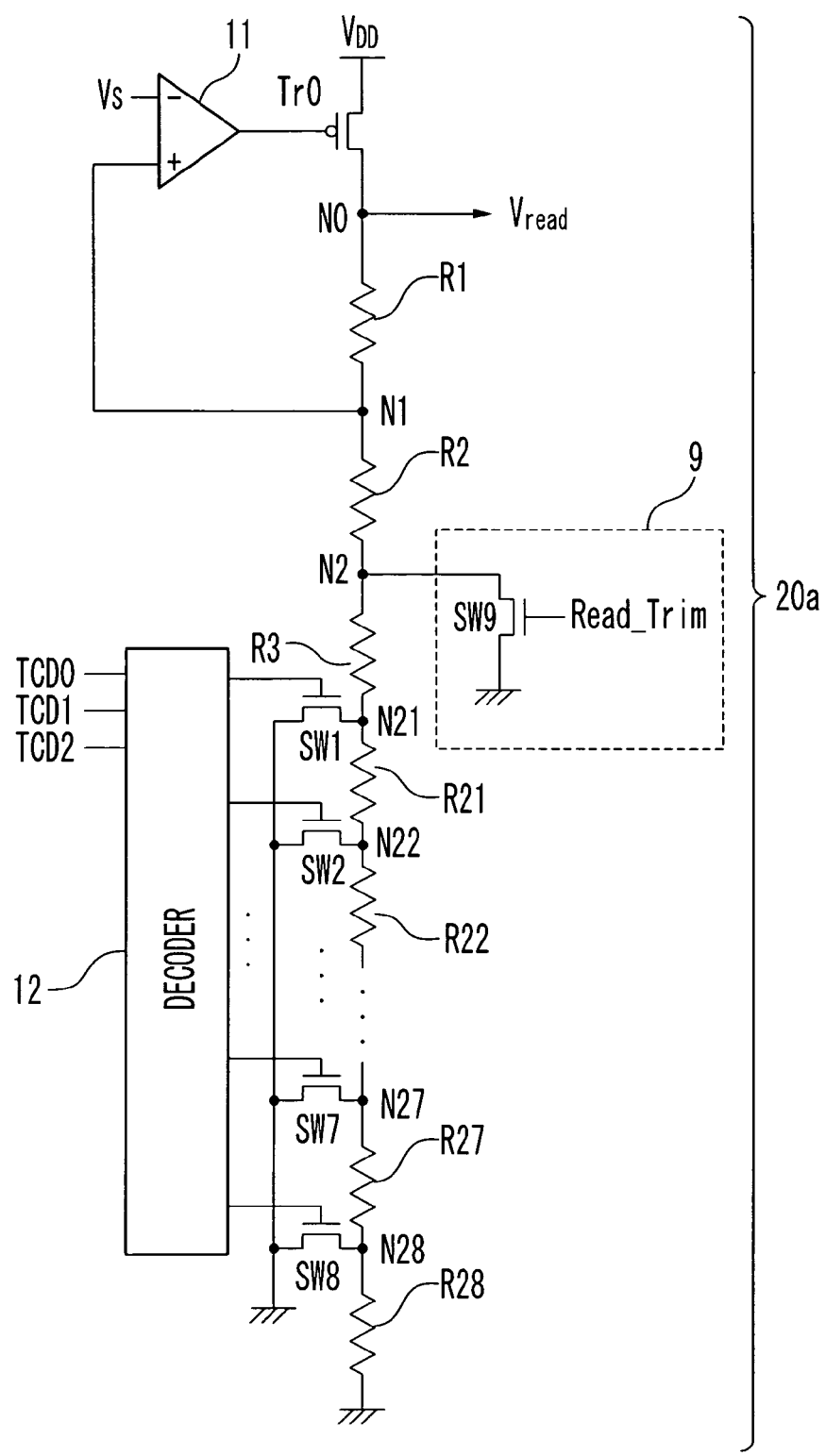
FIG. 6 is a block diagram showing a read voltage generating circuit in the nonvolatile semiconductor memory device according to the first embodiment of the present invention.

FIG. 6 is a block diagram showing an example of the read voltage generating circuit 20 in the nonvolatile semiconductor memory device according to the first embodiment of the present invention. The read voltage generating circuit 20 has a reference word line voltage generating circuit 20a as a regulator circuit and a voltage changing circuit 9. The reference word line voltage generating circuit 20a has an operational amplifier 11, a PMOS transistor Tr0, resistances R1, R2, R3, R21 to R28, switches SW1 to SW8 and a decoder 12. The operational amplifier 11 is connected to the reference voltage $V_s$ at an inversion input terminal, to a node N1 at a non-inversion input terminal and to a gate of the PMOS transistor Tr0 at an output terminal. The reference voltage $V_s$ is 1.25V, for example. The PMOS transistor Tr0 is connected to a power supply voltage $V_{DD}$ at a source and to a node N0 at a drain. The power supply voltage $V_{DD}$ is 5.0 V, for example. The resistance R1 is connected between the node N0 and the node N1. The value of the resistance R1 is 600 kΩ, for example. The resistance R2 is connected between the node N1 and a node N2. The value of the resistance R2 is 420 kΩ, for example. The resistance R3 is connected between the node N2 and a node N21. The value of the resistance R3 is 100 kΩ, for example.

The resistances R21 to R28 are connected in series in this order. One end of the resistance R21 is connected to the node N21 and the other end of the resistance R28 is connected to the ground. That is, the resistance R21 is connected between the node N21 and to a node N22, and the resistance R22 is connected between the node N22 and a node N23. The resistance R23 is connected between the node N23 and a node N24, and the resistance R24 is connected between the node N24 and a node N25. The resistance R25 is connected between the node N25 and a node N26, and the resistance R26 is connected between the node N26 and a node N27. The resistance R27 is connected between the node N27 and a node N28, and the resistance R28 is connected between the node N28 and the ground. The resistance values of these resistances are 20 kΩ, for example.

The switches SW1 to SW8 are NMOS transistors, for example. The switch SW1 is connected to the node N21 at a drain, to the ground at a source, and to the decoder 12 at a gate. The switch SW2 is connected to the decoder 12 at a gate, to the node N22 at a drain and to the ground at a source. The switch SW3 is connected to the decoder 12 at a gate, to the node N23 at a drain and to the ground at a source. The switch SW4 is connected to the decoder 12 at a gate, to the node N24 at a drain and to the ground at a source. The switch SW5 is connected to the decoder 12 at a gate, to the node N25 at a drain and to the ground at a source. The switch SW6 is connected to the decoder 12 at a gate, to the node N26 at a drain and to the ground at a source. The switch SW7 is connected to the decoder 12 at a gate, to the node N27 at a drain and to the ground at a source. The switch SW8 is connected to the decoder 12 at a gate, to the node N28 at a drain and to the ground at a source.

The decoder 12 controls ON/OFF of each of the switches SW1 to SW8 on the basis of the trimming data TCD (TCD0 to TCD2) supplied from the control unit 7. For example, when the switches SW1 to SW8 are NMOS transistors, ON/OFF of each switch is controlled by controlling a gate voltage of the switch. Thus, the read voltage generating circuit 20 controls the read voltage $V_{read}$ outputted from the node N0. Since the trimming data TCD is not supplied when the trimming data is read in the reset sequence, a default is used (for example, all of the switches SW1 to SW8 are turned OFF).

The voltage changing circuit 9 has a switch SW9. The switch SW9 is an NMOS transistor. The switch SW9 is connected to the node N2 at a drain, to the ground at a source and to the control unit 7 at a gate. When the trimming data is read in the reset sequence, the trimming read signal Read_Trim is supplied from the control unit 7 to the gate of the switch SW9.

The read voltage generating circuit 20 generates the constant read voltage $V_{read}$ (for example, 2.5 V) on the basis of the reference voltage $V_s$ and the trimming data TCD. At this time, even when the reference voltage $V_s$ slightly deviates, the decoder 12 of the read voltage generating circuit 20 selects one of the switches SW1 to SW8 on the basis of the trimming data TCD (TCD0 to TCD2) to change the resistance value from the node N1 to the ground, thereby the read voltage generating circuit 20 adjusts the read voltage $V_{read}$ to a desired voltage (for example, 2.5 V).

Furthermore, when the trimming read signal Read_Trim is set to "H" in the voltage changing circuit 9, the switches SW9 is turned on. Therefore, the read voltage $V_{read}$ can be increased. For example, in case of the reference voltage $V_s$=1.25 V, R1=600 kΩ, R2=420 kΩ, R3=100 kΩ, R21= R22= ... =R28=20 kΩ, the read voltage $V_{read}$ can be adjusted from 2.35 V to 2.69 V by switching the switches SW1 to SW. Here, when the switch SW9 is turned on, the read voltage $V_{read}$ is increased and irrespective of the states of the switches SW1 to SW8, the read voltage $V_{read}$ is set to 3.03 V.

Figure 7:
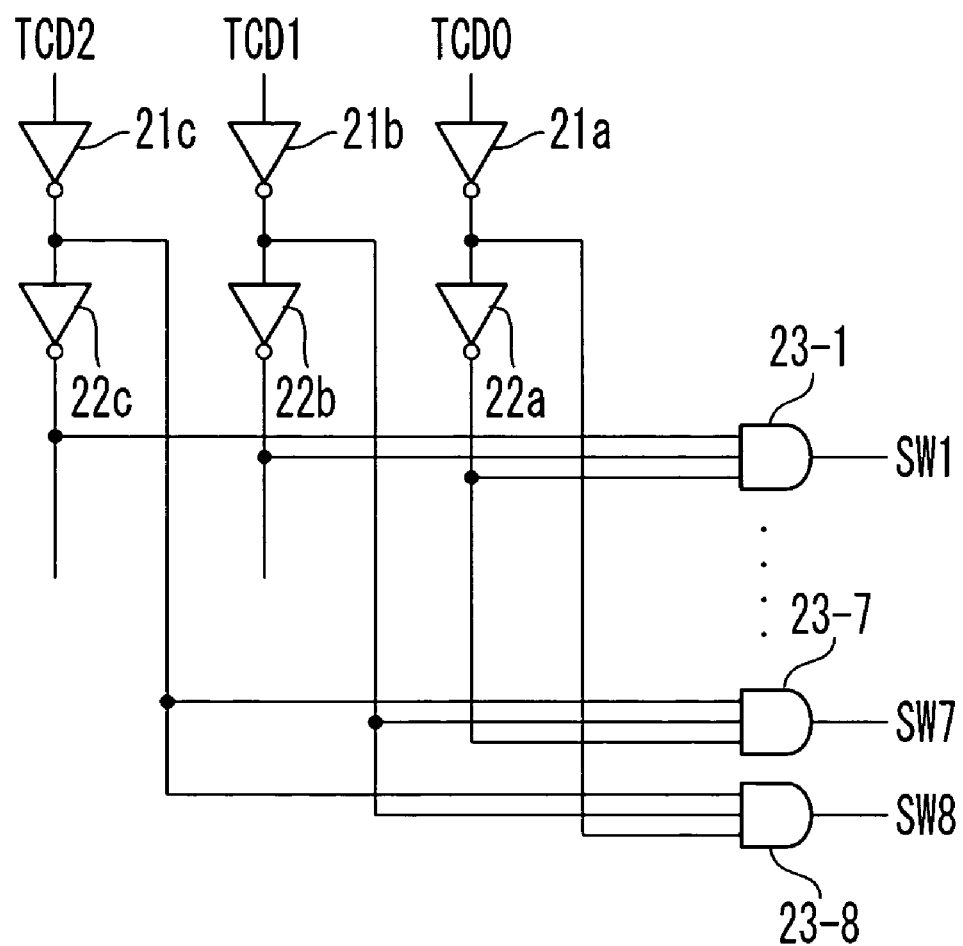
FIG. 7 is a block diagram showing configuration of a decoder circuit in the nonvolatile semiconductor memory device according to the first embodiment of the present invention.

FIG. 7 is a block diagram showing the configuration of the decoder 12. The decoder 12 has inverters 21a to 21c and 22a to 22c, corresponding to trimming data TCD0, TCD and TCD2, respectively. For the trimming data TCD0, a first output of the inverter 21a which receives the trimming data TCD0 and a fourth output of the inverter 22a which connected to the output of the inverter 21a are outputted. Similarly, for the trimming data TCD1, a second output of the inverter 21b which receives the trimming data TCD1 and a fifth output of the inverter 22b which connected to the output of the inverter 21b are outputted. For the trimming data TCD2, a third output of the inverter 21c which receives the trimming data TCD2 and a sixth output of the inverter 22c which connected to the output of the inverter 21c are outputted. The decoder 12 further has eight AND circuits 23-1 to 23-8. The AND circuit 23-1 receives the fourth output, the fifth output and the sixth output and outputs an AND calculation result to the gate of the SW1. The circuit 23-2 receives the first output, the fifth output and the sixth output and outputs an AND calculation result to the gate of the SW2. The AND circuit 23-3 receives the fourth output, the second output and the sixth output and outputs an AND calculation result to the gate of the SW3. The AND circuit 23-4 receives the first output, the second output and the sixth output and outputs an AND calculation result to the gate of the SW4. The AND circuit 23-5 receives the fourth output, the fifth output and the third output and outputs an AND calculation result to the gate of the SW5. The AND circuit 23-6 receives the first output, the fifth output and the fourth output and outputs an AND calculation result to the gate of the SW6. The AND circuit 23-7 receives the fourth output, the second output and the third output and outputs an AND calculation result to the gate of the SW7. The AND circuit 23-8 receives the first output, the second output and the third output and outputs an AND calculation result to the gate of the SW8.

Figure 8:
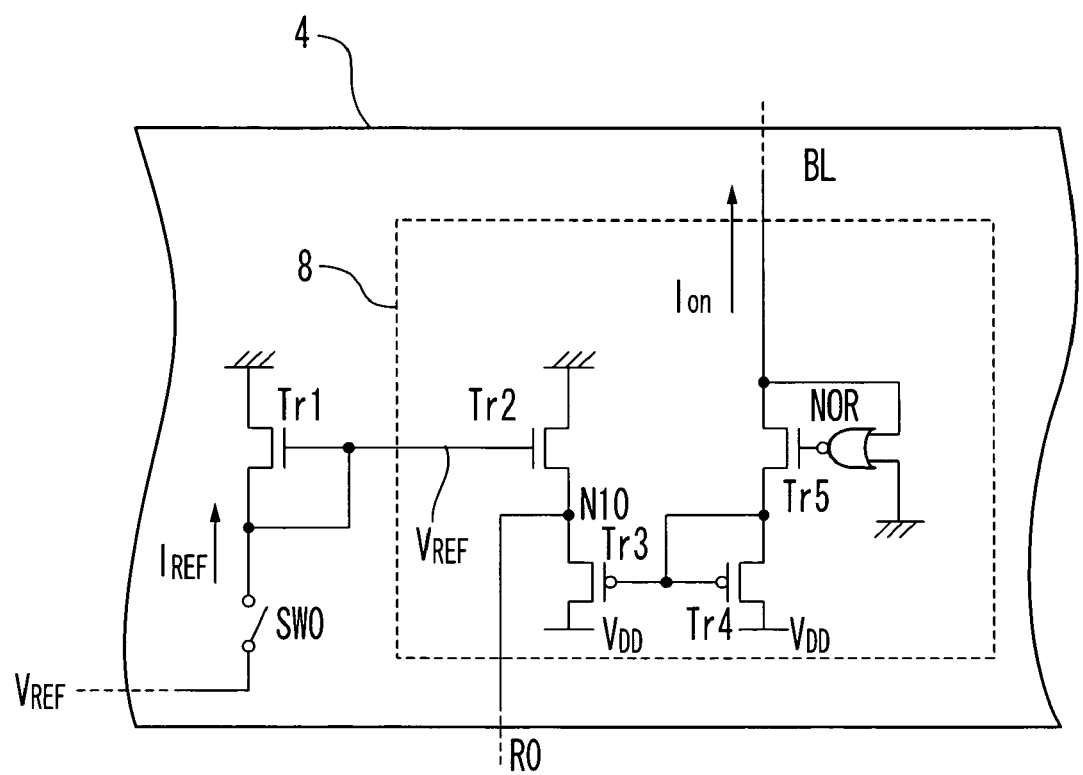
FIG. 8 is a block diagram showing a configuration of a sense amplifier circuit in the nonvolatile semiconductor memory device according to the first embodiment of the present invention.
Figure 9:
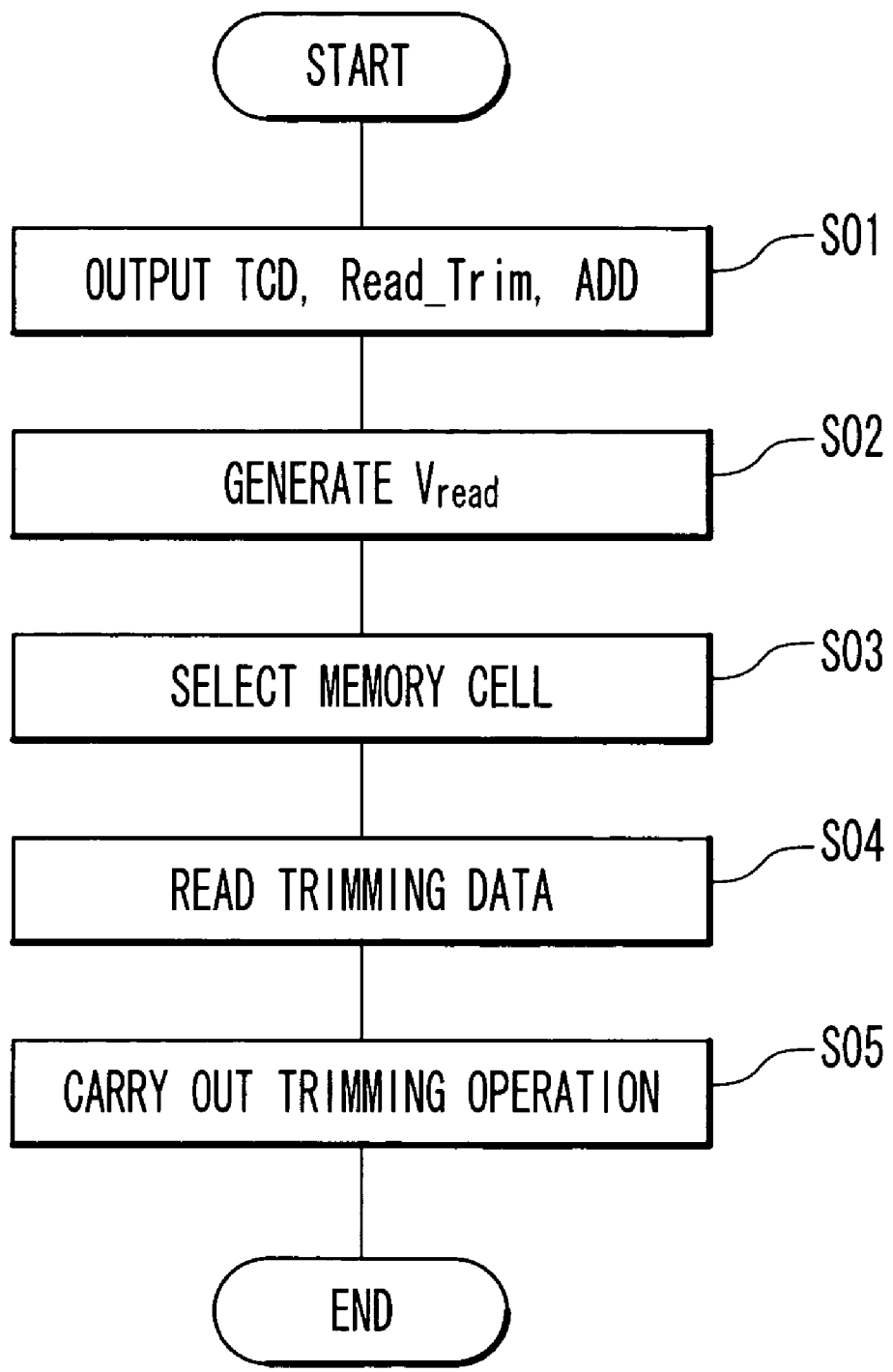
FIG. 9 is a flow chart showing an operation of the nonvolatile semiconductor memory device according to the first embodiment of the present invention.

FIG. 8 is a circuit diagram showing the configuration of the sense amplifier circuit 4. Here, the sense amplifier for 1 bit is shown. The sense amplifier circuit 4 has a circuit 8 corresponding to each bit line BL. The circuit 8 includes NMOS transistors Tr2 and Tr5, PMOS transistors Tr3 and Tr4 and an NOR circuit. The NMOS transistor Tr1 is connected to the circuit 8. The NMOS transistor Tr2 is connected to the ground at a source, to the node N10 at a drain and to a gate of the NMOS transistor Tr1 at a gate. The NMOS transistor Tr1 is connected to the ground at a source and to a circuit for generating the reference voltage $V_{REF}$ at a drain and the gate through the switch SW0. That is, the NMOS transistor Tr1 and the NMOS transistor Tr2 form a current mirror circuit. The NMOS transistor Tr1 may be included in the circuit 8. On the other hand, the PMOS transistor Tr3 is connected to the power supply $V_{DD}$ at a source, to the node N10 at a drain and to a gate of the NMOS transistor Tr4 at a gate. The PMOS transistor Tr4 is connected to the power supply $V_{DD}$ at a source and to the drain of the NMOS transistor Tr5 at a gate and a drain. That is, the PMOS transistor Tr3 and the PMOS transistor Tr4 form a current mirror circuit. A wire RO is connected to the node N10 to connect it to the trimming register 6. The NMOS transistor Tr5 is connected to the drain of PMOS transistor Tr4 at a source, to the bit line BL at a drain and to an output of the NOR circuit at a gate. The NOR circuit is connected to the bit line BL at one input and to the ground at the other input.

The sense amplifier circuit 4 compares the sense amplifier reference current $I_{REF}$ flowing due to the reference voltage $V_{REF}$ with the memory cell current $I_{on}$ passing through the bit line BL to the selected memory cell. When the memory cell current $I_{on}$ is larger than the sense amplifier reference current $I_{REF}$, the wire RO is set into the "H" state. When the memory cell current $I_{on}$ is smaller than the sense amplifier reference current $I_{REF}$, the wire RO is set into the "L" state. As the difference between the cell current $I_{on}$ and the sense amplifier reference current $I_{REF}$ increases, the operation of the sense amplifier is accelerated. The reference current $I_{REF}$ is supplied to the sense amplifier circuit 4 in the form of the reference voltage $V_{REF}$.

Next, with reference to FIGS. 5 to 9, an operation of the nonvolatile semiconductor memory device according to the first embodiment of the present invention will be described. The operation is in the reset sequence.

Data is generated to adjust the difference between initial values of the read voltage $V_{read}$ and the reference voltage $V_{REF}$ and optimum values on the basis of a result of a typical operation test (wafer test) of a semiconductor device, and the generated data is stored in the trimming data storage area 3 as optimum trimming data. The control unit 7 is set to output the trimming read signal Read_Trim and the reset sequence trimming data TCD to the read voltage generating circuit 20 in the read operation to the trimming data storage area 3 (reset sequence). The control unit 7 outputs the reset sequence trimming data TCD and the trimming read signal Read_Trim to the read voltage generating circuit 20. The control unit 7 further outputs the address data ADDX to the X decoder circuit 5a and the address data ADDy to the Y decoder circuit 5b at a predetermined timing (S01).

Referring to FIG. 6, the decoder 12 of the read voltage generating circuit 20 turns off the switches SW1 to SW8 on the basis of the reset sequence trimming data TCD. The voltage changing circuit 9 of the read voltage generating circuit 20 turns on the switch SW9 on the basis of the trimming read signal Read_Trim ("H"). Thus, as described with reference to FIG. 6, the read voltage $V_{read}$=3.0 V, which is different from the normal read voltage $V_{read}$=2.5 V, is generated at the node N10 as an output of the read voltage generating circuit 20. The read voltage $V_{read}$ is supplied to the X decoder circuit 5a (S02).

The read voltage $V_{read}$ (3.0 V) and the address data ADDX (ADDX0 to ADDX2) are supplied to the X decoder circuit 5a. On the basis of the address data ADDX in the trimming data storage area 3, the X decoder circuit 5a applies the read voltage $V_{read}$ to the selected word line WL and sets the other word lines WL to the ground voltage. Furthermore, the address data ADDy (ADDy0 to ADDy2) is supplied to the Y decoder circuit 5b. On the basis of the address data ADDy, the Y decoder circuit 5b applies a predetermined read voltage to the selected bit line BL and sets the other bit lines BL to the ground voltage. All source lines SL are set to the ground voltage. In this manner, the selected memory cell connected to the selected bit line and the selected word line is selected (S03). For example, in FIG. 2, when data is read out by using the memory cell M11 as the selected memory cell, the word line WL3 connected to the gate of the selected memory cell M11 is selected and the read voltage $V_{read}$ (3.0 V) is applied thereto and the other word lines WL are set to ground voltage. The bit line BL0 connected to the drain of the selected memory cell M11 is selected and the predetermined read voltage is applied thereto and the other bit lines BL are set to the ground voltage.

Figure 10:
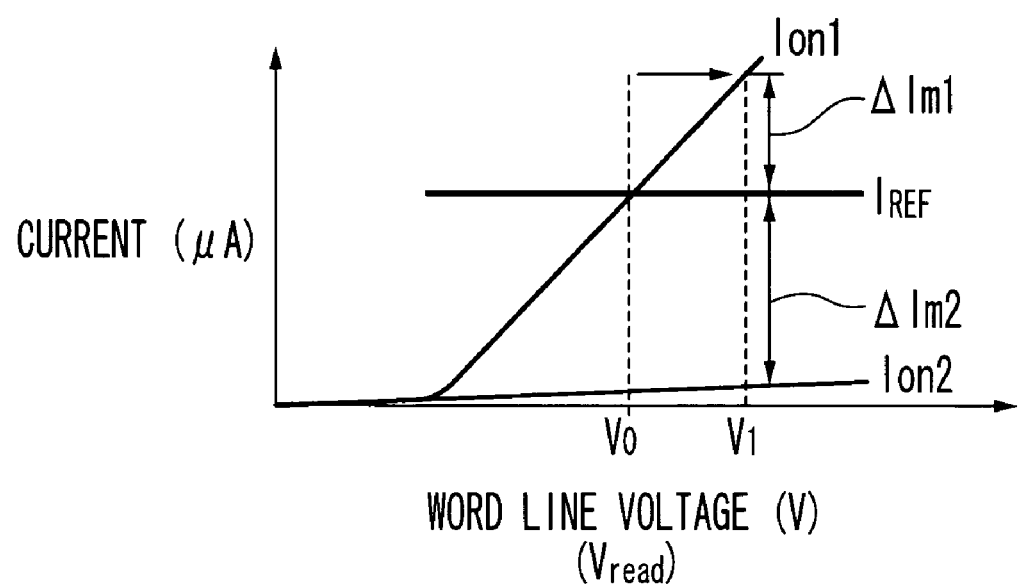
FIG. 10 is a graph showing a relationship between read voltage, cell current and sense amplifier reference current in the nonvolatile semiconductor memory device according to the first embodiment of the present invention.

The sense amplifier circuit 4 reads out data stored in the selected memory cell on the basis of the reference voltage $V_{REF}$ and the voltage applied to the selected bit line (step S04). FIG. 10 is a graph showing a relationship between the read voltage and the memory cell current and sense amplifier reference current in the nonvolatile semiconductor memory device according to the first embodiment of the present invention. A horizontal axis represents the read voltage $V_{read}$ (word line voltage), and a vertical axis represents the cell current $I_{on}$ and the sense amplifier reference current $I_{REF}$. The ON-state memory cell current $I_{on1}$ as the cell current $I_{on}$ passes through the ON-state memory cell on the basis of the voltage applied to the selected bit line. The ON-state memory cell current $I_{on1}$ is rapidly increased with increase in the word line voltage. On the other hand, the OFF-state memory cell current $I_{on2}$ as the cell current $I_{on}$ passes through the OFF-state memory cell on the basis of the voltage applied to the selected bit line. The OFF-state memory cell current $I_{on2}$ is slightly increased with increase in the word line voltage. The sense amplifier reference current $I_{REF}$ passing on the basis of the reference voltage $V_{REF}$ is constant irrespective of the word line voltage.

Figure 4:
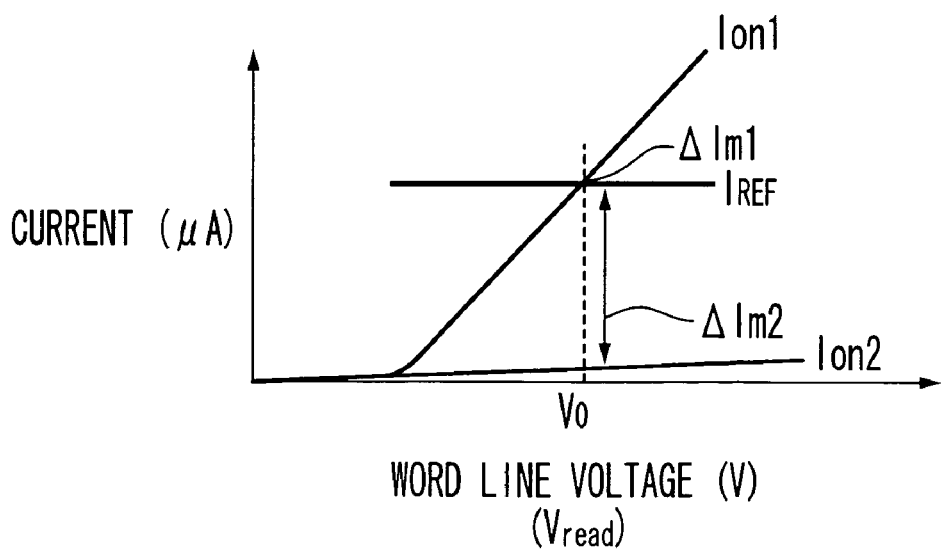
FIG. 4 is a graph showing another relationship between the read voltage, the cell current and the sense amplifier reference current the conventional nonvolatile memory.

Here, when the sense amplifier reference current $I_{REF}$ is higher than that in the normal case shown in FIG. 4 is considered. As described above (FIG. 4), in case of the read voltage $V_{read}$=$V_0$ (2.5 V), the sense amplifier circuit 4 cannot read data. According to the present invention, however, the read voltage $V_{read}$ applied to the word line is set to be V1 (3.0 V), not V0 (2.5 V). When the read voltage $V_{read}$ is set as $V_1$ (3.0 V)>$V_0$ in the read operation of the trimming data in the reset sequence, the ON-state memory cell current $I_{on1}$ is increased. Thus, in case of the read voltage $V_{read}$=$V_1$, the on margin $\Delta I_{m1}$ (for example, 5 µA) can be sufficiently ensured. Therefore, the sense amplifier circuit 4 can read data stored in the selected memory cell (ON-state memory cell). That is, the read voltage $V_{read}$ should be set so that the difference between the ON-state memory cell current $I_{on1}$ and the sense amplifier reference current $I_{REF}$ may be minimum current value which can be read by the sense amplifier circuit 4 or more. At this time, although the off margin $\Delta I_{m2}$ (for example, 8 µA) is decreased due to increase in the read voltage $V_{read}$, since the decreased amount is small, there is no problem in the read operation of data. That is, data stored in the selected memory cell (OFF-state memory cell) can be also read. Thus, the trimming data in the selected memory cells of the trimming data storage area 3 can be normally read out in the reset sequence.

As described above, in order to reliably read the trimming data irrespective of the value of the sense amplifier reference current $I_{REF}$, the read voltage $V_{read}$ should be set so that the difference between the ON-state memory cell current $I_{on1}$ and the sense amplifier reference current $I_{REF}$ may be minimum current value which can be read by the sense amplifier circuit 4 or more. In other words, it is preferred that the read voltage $V_{read}$ in this case is set to be higher than the read voltage $V_{read}$ used for the read operation of data in the user area 2. Thus, the memory cell currents (the ON-state memory cell current and the OFF-state memory cell current) when the trimming data is read out is larger than the memory cell current when the data held in the user area 2 is read at all times.

More preferably, the read voltage $V_{read}$ is set as follows. The read voltage $V_{read}$ applied to the word lines WL used to select the memory cell M in the user area 2 is adjusted to an optimum value in a predetermined voltage range on the basis of the trimming data stored in the trimming data storage area 3. An upper limit value of a predetermined voltage range is set so that read disturb life time may be desired time or longer and a lower limit value of the predetermined voltage range is set so that the trimming data may be read. The reason why the read voltage $V_{read}$ is set within the voltage range is that when the voltage out of the voltage range is set as the read voltage, deterioration of the memory cell is accelerated. As a result, the read disturb life time is shortened, which is problematic as a product. Thus, the product which cannot perform a proper operation even when the voltage is set within the voltage range is regarded as a defective product. Consequently, without considering the read disturb life time, a non-defective product could reliably read data in any memory cell as long as a voltage exceeding the upper limit in the voltage range is set as the read voltage $V_{read}$. At this time, since the number of times of accesses to the memory cells in the trimming data storage area 3 is extremely smaller than that of accesses to the memory cells in the user area 2, even when the voltage exceeding the upper limit in the voltage range is set as the read voltage $V_{read}$, no influence is exerted on the read disturb life time. That is, more preferably, the read voltage $V_{read}$ at the trimming data read operation is set to be the upper limit value in the voltage range or larger.

According to the present invention, even in case of the normal sense amplifier reference current $I_{REF}$ (case shown in FIG. 3), the read voltage $V_{read}$ is increased in the reset sequence. At this time, although the off margin $\Delta I_{m2}$ is decreased due to increase in the read voltage $V_{read}$, since the decreased amount is small, there is no problem in the read operation of the data. Since the on margin $\Delta I_{m1}$ is increased with increase in the read voltage $V_{read}$, there is no problem in the read operation of data. Here, there is a concern for disturb due to increase in the voltage $V_{read}$. However, since life cycle access time of the trimming data storage area 3 is short, such problem does not occur.

The read-out trimming data is stored in the trimming register 6. The trimming data in the trimming register 6 is used for trimming of the nonvolatile semiconductor memory device 10 (S05). That is, when reading of the data held in the selected memory cell of the trimming data storage area 3 is finished in the reset sequence, the control unit 7 acquires the trimming data and outputs the trimming data to the read voltage generating circuit 20 and the reference voltage generating circuit 17.

In the read voltage generating circuit 20, the switch SW9 is turned off by the trimming read signal Read_Trim ("L"). Thus, the resistance R3 of the read voltage generating circuit 20 becomes valid and the read voltage generating circuit 20 outputs the normal read voltage $V_{read}=V_0$. When $V_0$ is shifted from a desired value (for example, 2.5 V), the read voltage $V_{read}$ can be set extremely close to the desired value by adjusting the switches SW1 to SW8 of the decoder 12 on the basis of the optimum trimming data TCD obtained in the reset sequence. On the other hand, when the sense amplifier reference current $I_{REF}$ is shifted from the desired value in the reference voltage generating circuit 17, the sense amplifier reference current $I_{REF}$ can be set to the optimum value by adjusting the reference voltage $V_{REF}$ on the basis of the optimum trimming data TCD2 obtained in the reset sequence. By adjusting the read voltage $V_{read}$ and the reference voltage $V_{REF}$ in this manner, the read operation of data in the memory cells M in the user area 2 can be performed under an optimum condition.

According to the present invention, by increasing the word line voltage (read voltage $V_{read}$) in the reset sequence, the ON margin $\Delta I_{m1}$ is ensured. When the word line voltage is increased in the data read operation, data in the memory cells M may be changed due to disturbance. For this reason, this is not generally performed. According to the present invention, since the word line voltage is increased only in the read operation of data in the trimming data storage area in which the life cycle access time is short, change in the data in the memory cells M does not cause any problem. The reasons are that an amount of the data stored in the trimming data storage area is small and that the memory cells in the trimming data storage area are accessed only in the reset sequence and thus the life cycle access time is short.

Figure 11:
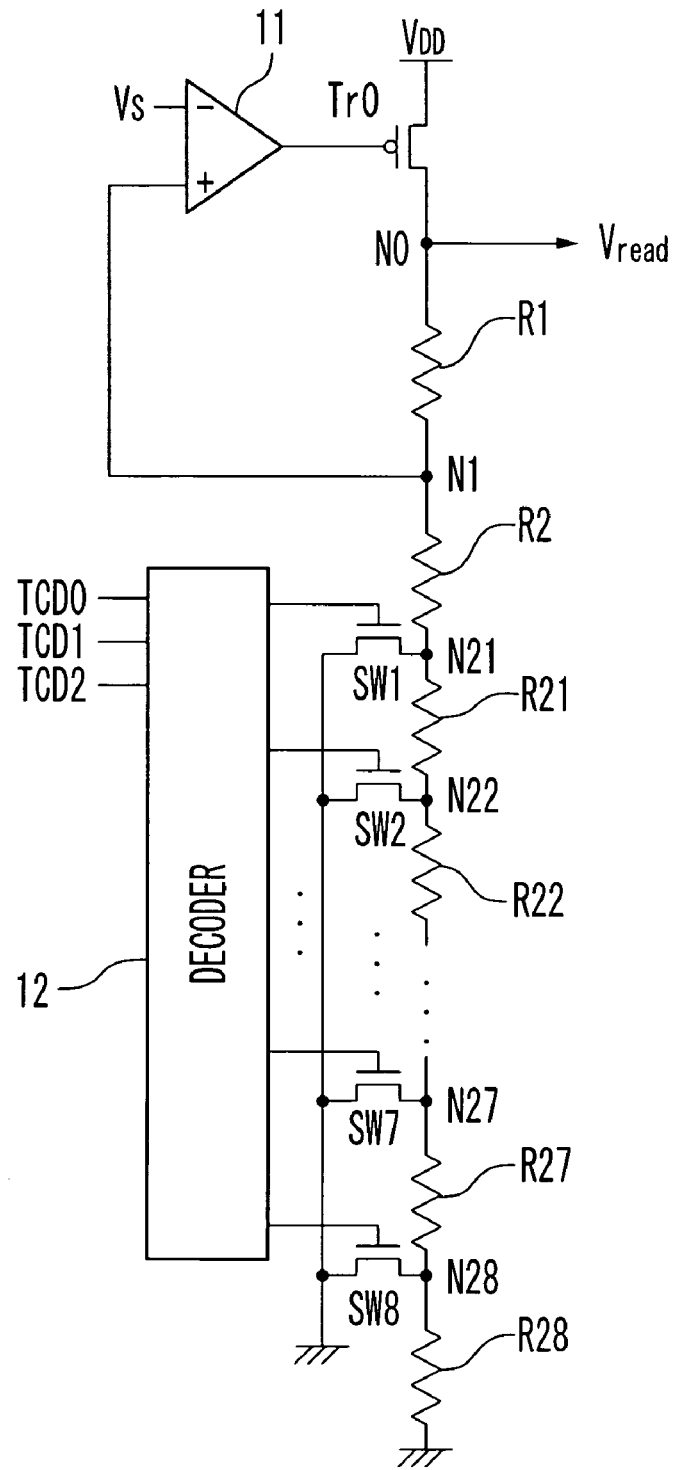
FIG. 11 is a block diagram showing another configuration of a read voltage generating circuit in the nonvolatile semiconductor memory device according to the first embodiment of the present invention.
Figure 12:
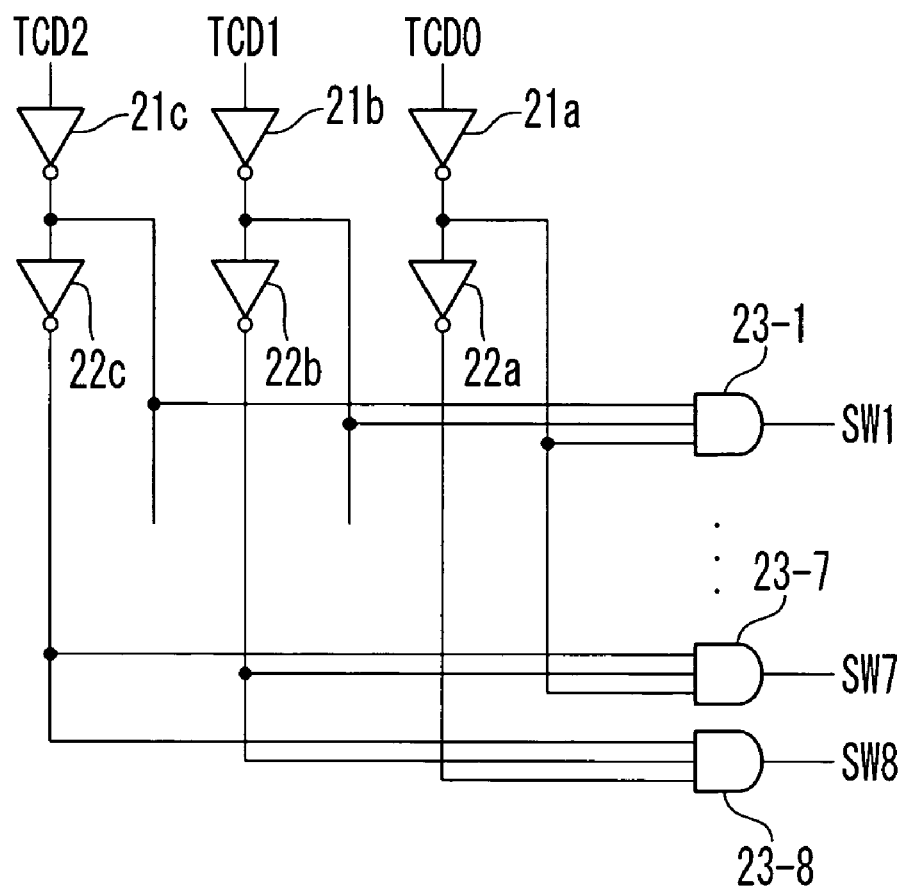
FIG. 12 is a block diagram showing a configuration of a decoder shown in FIG. 11.

In the read voltage generating circuit 20 in FIG. 6 the read voltage $V_{read}$ is generated in the reset sequence by using the voltage changing circuit 9. However, without the voltage changing circuit 9, adjustment is possible on the basis of the trimming data. FIG. 11 is a circuit diagram showing another example of configuration of the read voltage generating circuit 20 of the nonvolatile semiconductor memory device according to the first embodiment of the present invention. The read voltage generating circuit 20 is different from the read voltage generating circuit 20 in FIG. 6 in that the resistance R3 is omitted, the value of the R21 to R28 is 45 kΩ and the decoder 12 is modified as shown in FIG. 12. The decoder 12 is designed so that the reset sequence trimming data TCD (TCD0 to TCD2) is set as a unique value supplied in the reset sequence (for example, all "L", this is defined as a default code) and only the switch SW1 is turned on according to the trimming data TCD. With such setting, in the reset sequence, the read voltage $V_{read}$ is set to 3.03 V, and after the reset sequence, the read voltage $V_{read}$ can be set to a value close to the desired read voltage $V_{read}$ (2.5V) by turning on one of the witches SW1 to SW8 on the basis of the trimming data TCD obtained in the wafer test. In this embodiment, a voltage trimming accuracy which can be adjusted by the switches SW1 to SW8 is rough. However, if the number of decoding operations in the decoder 12 and the number of switches SW are increased, the trimming accuracy can be improved.

FIG. 12 is a block diagram showing an example of configuration in which the decoder 12 in FIG. 11 is modified for the present invention. The decoder 12 has the inverter 21a and the inverter 22a, the inverter 21b and the inverter 22b, and the inverter 21c and the inverter 22c, which correspond to trimming data TCD0, TCD and TCD2, respectively. For the trimming data TCD0, the first output of the inverter 22a which receives the trimming data TCD0 and the fourth output of the inverter 21a which receives the first output are outputted. Similarly, for the trimming data TCD1, the second output of the inverter 21b which receives the trimming data TCD1 and the fifth output of the inverter 22b which receives the second output are outputted. For the trimming data TCD2, the third output of the inverter 21c which receives the trimming data TCD2 and the sixth output of the inverter 22c which receives the third output are outputted. The decoder 12 further has eight AND circuits 23-1 to 23-8. The AND circuit 23-1 receives the first output, the second output and the third output and outputs an AND calculation result to the gate of the SW1. The circuit 23-2 receives the fourth output, the second output and the third output and outputs an AND calculation result to the gate of the SW2. The AND circuit 23-3 receives the first output, the fifth output and the fourth output and outputs an AND calculation result to the gate of the SW3. The AND circuit 23-4 receives the fourth output, the fifth output and the third output and outputs an AND calculation result to the gate of the SW4. The AND circuit 23-5 receives the first output, the second output and the sixth output and outputs an AND calculation result to the gate of the SW5. The AND circuit 23-6 receives inputs the fourth output, the second output and the sixth output and outputs an AND calculation result to the gate of the SW6. The AND circuit 23-7 receives the first output, the fifth output and the sixth output and outputs an AND calculation result to the gate of the SW7. The AND circuit 23-8 receives the fourth output, the fifth output and the sixth output and outputs an AND calculation result to the gate of the SW8.

According to the present invention, in the nonvolatile semiconductor memory device in which the shift of the sense amplifier reference current $I_{REF}$ is easier to occur as the ON-current $I_{on}$ decreases, a method for correctly reading data in the ON-state memory cell by making the word line voltage higher than usual and increasing the ON-state memory cell current $I_{on}$ even when the sense amplifier reference current $I_{REF}$ is shifted to the higher side is employed. Generally, the word line voltage is not made higher in the read operation in terms of read disturb. However, because of a special condition, for example, the amount of the data in the trimming data storage area to be read in the reset sequence is small, and the life cycle access time is short, the word line voltage can be made higher at the read operation.

Second Embodiment

Figure 13:
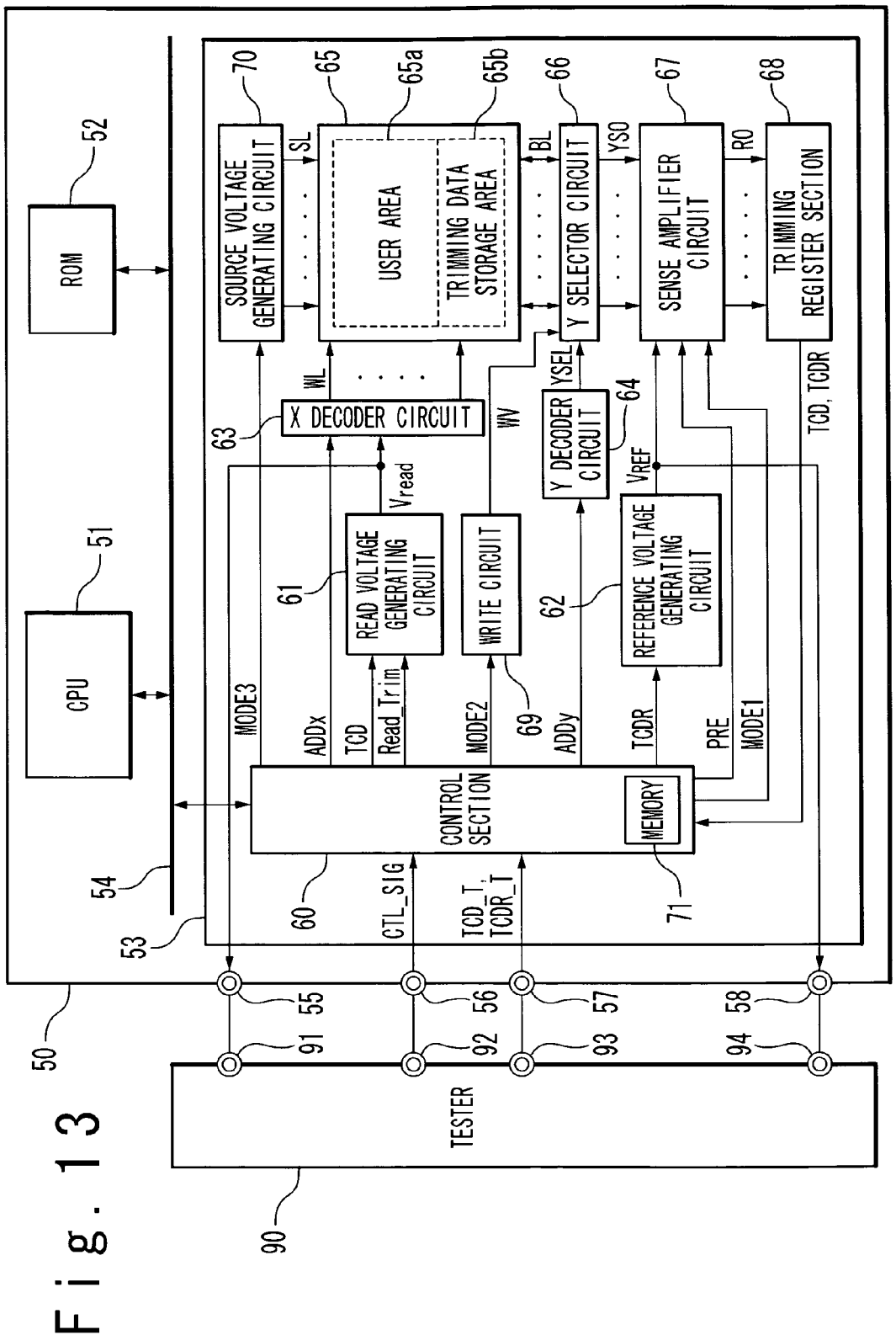
FIG. 13 is a block diagram showing a configuration of a microcomputer and a tester connected with the microcomputer according to the second embodiment of the present invention.

FIG. 13 is a block diagram showing the configuration of the microcomputer according to the second embodiment of the present invention and the tester connected with the microcomputer. In the second embodiment, the microcomputer containing the nonvolatile semiconductor memory device 10 which has been described in the first embodiment will be described.

The microcomputer 50 has a Central Processing Unit (CPU) 51, a Read Only Memory (ROM) 52, a nonvolatile semiconductor memory 53, a bus 54, input terminals 56 and 57 and output terminal 55 and 58. The CPU 51 executes a program stored in the ROM 52 and accesses the nonvolatile semiconductor memory 53 based on the program. The bus 54 is connected with the CPU 51, the ROM 52 and the nonvolatile semiconductor memory 53, and the CPU 51 can access the ROM 52 and the nonvolatile semiconductor memory 53 through the bus 54. Also, the tester 90 has input terminals 91 and 94 and output terminal 92 and 93, which are connected with the output terminals 55 and 58 and the input terminal 56 and 57 of the microcomputer 50, respectively, as shown in FIG. 13.

The nonvolatile semiconductor memory 53 has the same configuration and function as those of the nonvolatile semiconductor memory device 10 shown in first embodiment. A part thereof will be described in more detail than the nonvolatile semiconductor memory device 10 shown with first embodiment. That would be obvious to a person in the art but will be described for the purpose of confirmation. It should be noted that the details of the inside of each of the blocks such as the read voltage generating circuit 61 and the memory array 65 whose descriptions are omitted, are same as those of the read voltage generating circuit 20 and the memory array described in the first embodiment.

The nonvolatile semiconductor memory 53 includes a control section 60, a read voltage generating circuit 61, a reference voltage generating circuit 62, an X decoder circuit 63, a Y decoder circuit 64, a memory array 65, a Y selector circuit 66, a sense amplifier circuit 67, a trimming register section 68, a write circuit 69 and a source voltage generating circuit 70.

The control section 60 outputs a trimming data TCD for read voltage regulation and a trimming read signal Read_Trim to the read voltage generating circuit 61 and outputs a trimming data TCDR for reference voltage regulation to the reference voltage generating circuit 62. Also, the control section 60 outputs an address signal of a predetermined bit width (X address signal ADDX, Y address signal ADDy) to the X decoder circuit 63 and the Y decoder circuit 64, and outputs a precharge signal PRE to the sense amplifier circuit 67. Also, the control section 60 outputs a mode signal MODE1-3 to the sense amplifier circuit 67, the write circuit 69 and the source voltage generating circuit 70. Also, the control section 60 is supplied with a control signal CTL_SIG of a predetermined bit width from the tester 90 through the input terminal 56, with a trimming data TCD_T and TCDR_T for the test from tester 90 through the input terminal 57, and with the trimming data TCD and TCDR read out from the trimming data storage area 65b through the trimming register section 68, respectively. Moreover, the control section 60 accesses with the CPU 51 through the bus 54. It should be noted that the bit width of the trimming data TCD_TCDR (containing TCD_T, TCDR_T for the test) may be any bit width as in the first embodiment.

The read voltage generating circuit 61 generates a read voltage $V_{read}$ based on the trimming data TCD and the trimming read signal Read_Trim, and outputs it to the X decoder circuit 63. Also, the reference voltage generating circuit 62 generates a reference voltage $V_{REF}$ based on the trimming data TCDR, and outputs it to the sense amplifier circuit 67.

The X decoder circuit 63 selects a predetermined word line WL based on the X address signal ADDX, and applies the read voltage $V_{read}$ to the selected word line. Also, the Y decoder circuit 64 outputs a Y selection signal YSEL which has fixed bit width to select a predetermined bit line BL based on the Y address signal ADDy with a predetermined bit width to the Y selector 66.

The memory array 65 is composed of a user area 65a and a trimming data area 65b and each contains a plurality of memory cells (a plurality of memory cell transistors). The word lines WL are connected with the X decoder circuit 63, the bit line BL are connected with the Y selector 66, and source lines SL are connected with the source voltage generating circuit 70.

The Y selector 66 has a plurality of switch circuits connected with the bit lines BL, and connects a selected bit line through the wiring line YSO to the sense amplifier circuit 67 based on a Y selection signal YSEL and non-selected bit lines to the ground voltage.

The sense amplifier circuit 67 is connected with the Y selector, the wiring lines YSO, the trimming register section 68, and the wiring lines RO. Also, the reference voltage $V_{REF}$, a mode signal MODE1 and a precharge signal PRE are supplied to the sense amplifier circuit 67. The configuration of the sense amplifier circuit 67 will be described in detail with reference to FIG. 14.

The trimming register section 68 receives and holds the trimming data TCD and TCDR outputted from the sense amplifier circuit 67 through the wiring lines RO. Also, the held trimming data TCD and TCDR are outputted to the control section 60.

The write circuit 69 outputs a write voltage WV to the Y selector 66 based on the mode signal MODE2. The bit line BL which has been selected based on the Y selection signal YSEL is set to a predetermined write voltage (e.g., 0.5 V) due to this write voltage WV in the write mode. Also, the source voltage generating circuit 70 is connected with the source lines SL. A predetermined voltage (e.g., 8 V) is applied to the source line SL based on the mode signal MODE3 so as to carry out a write operation to the memory cell. The source lines SL are set to the ground voltage by the source voltage generating circuit 70 in a read mode.

Figure 14:
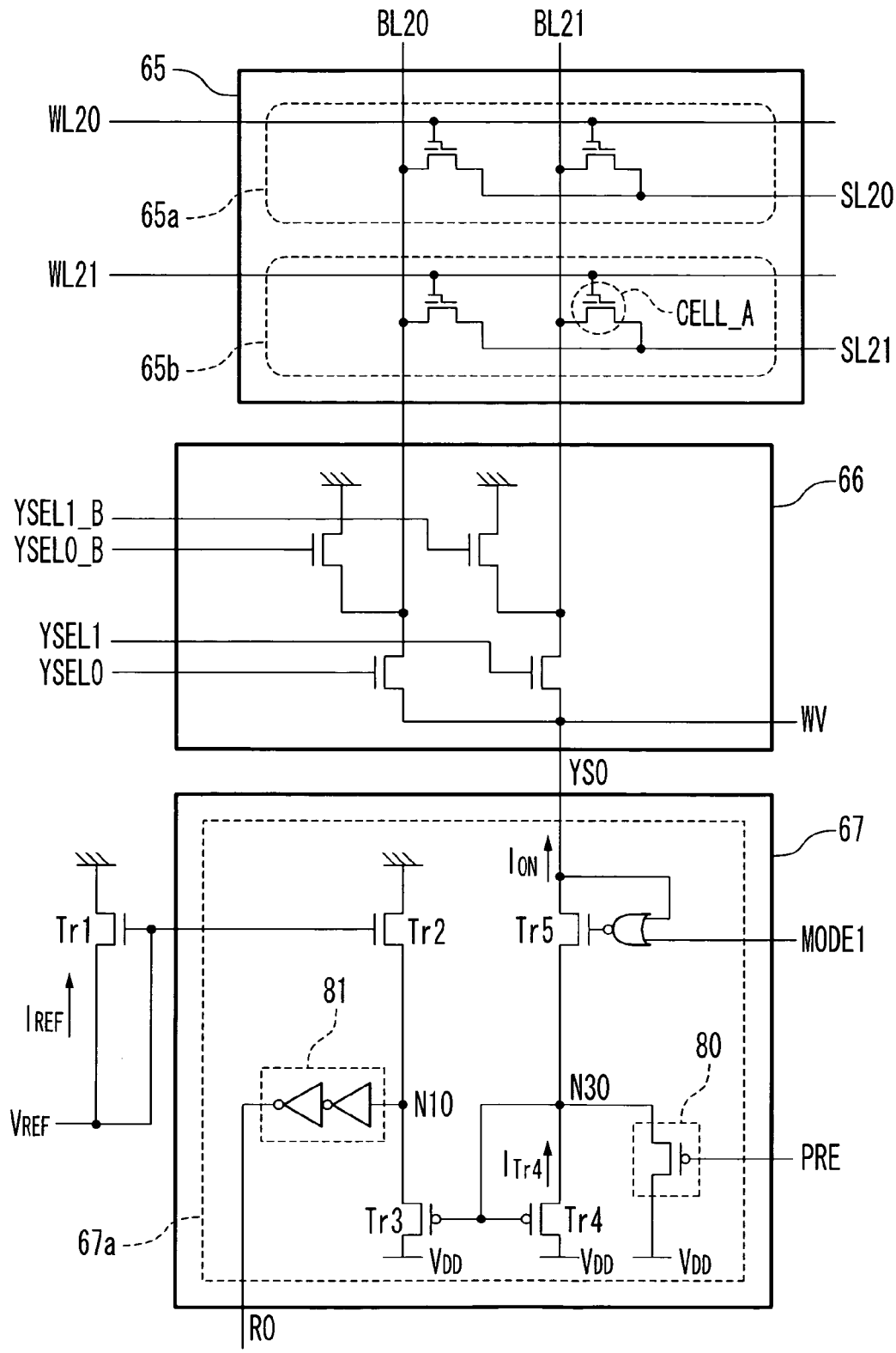
FIG. 14 is a diagram showing the configuration of a part of a nonvolatile memory array, a part of a sense amplifier circuit connected with the memory array and a part of a Y selector shown in FIG. 13.
Figure 15:
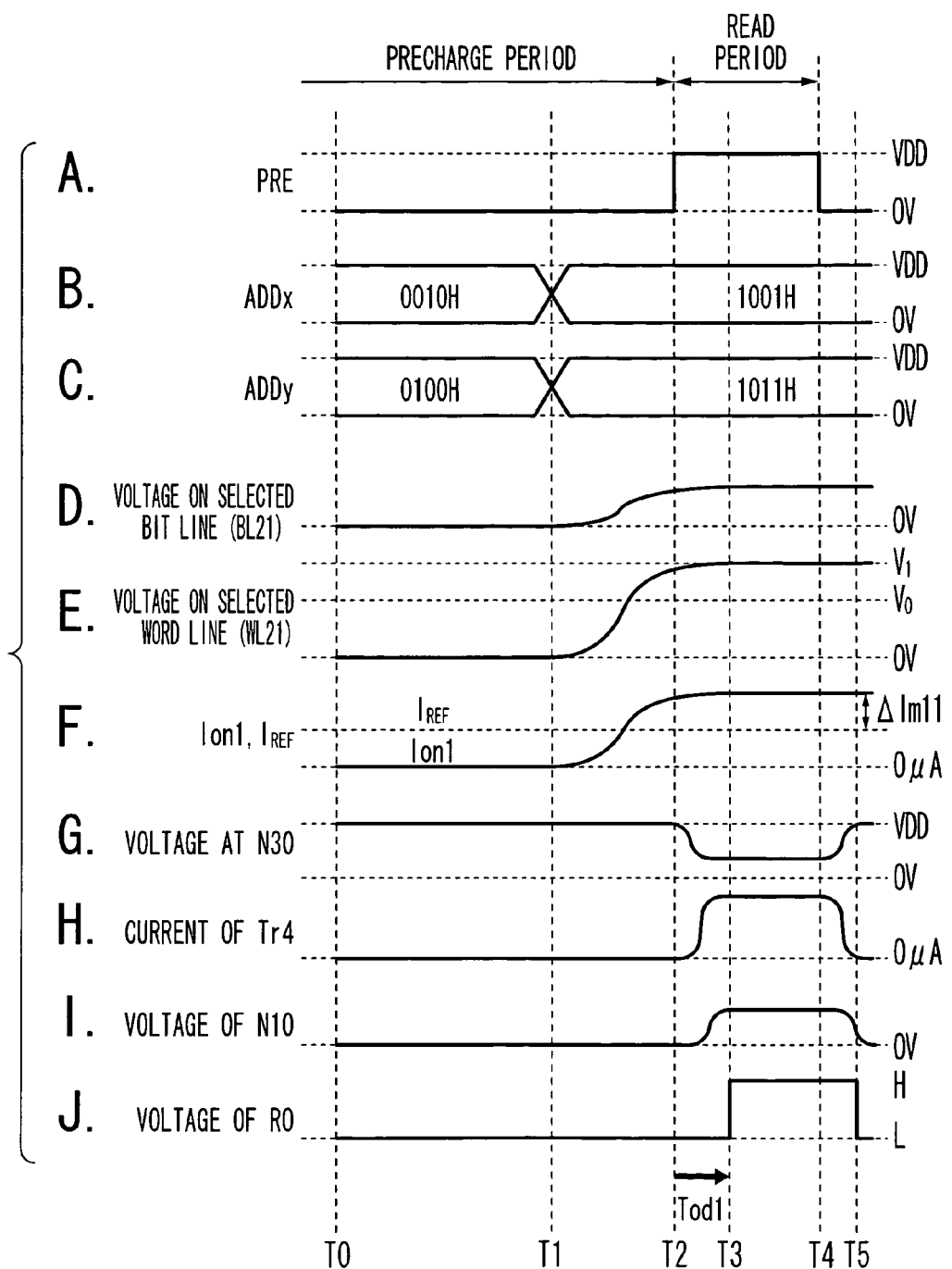
FIGS. 15A to 15J are timing charts showing operations of the tester and the microcomputer upon a read operation of trimming data in case of a reset sequence.
Figure 16:
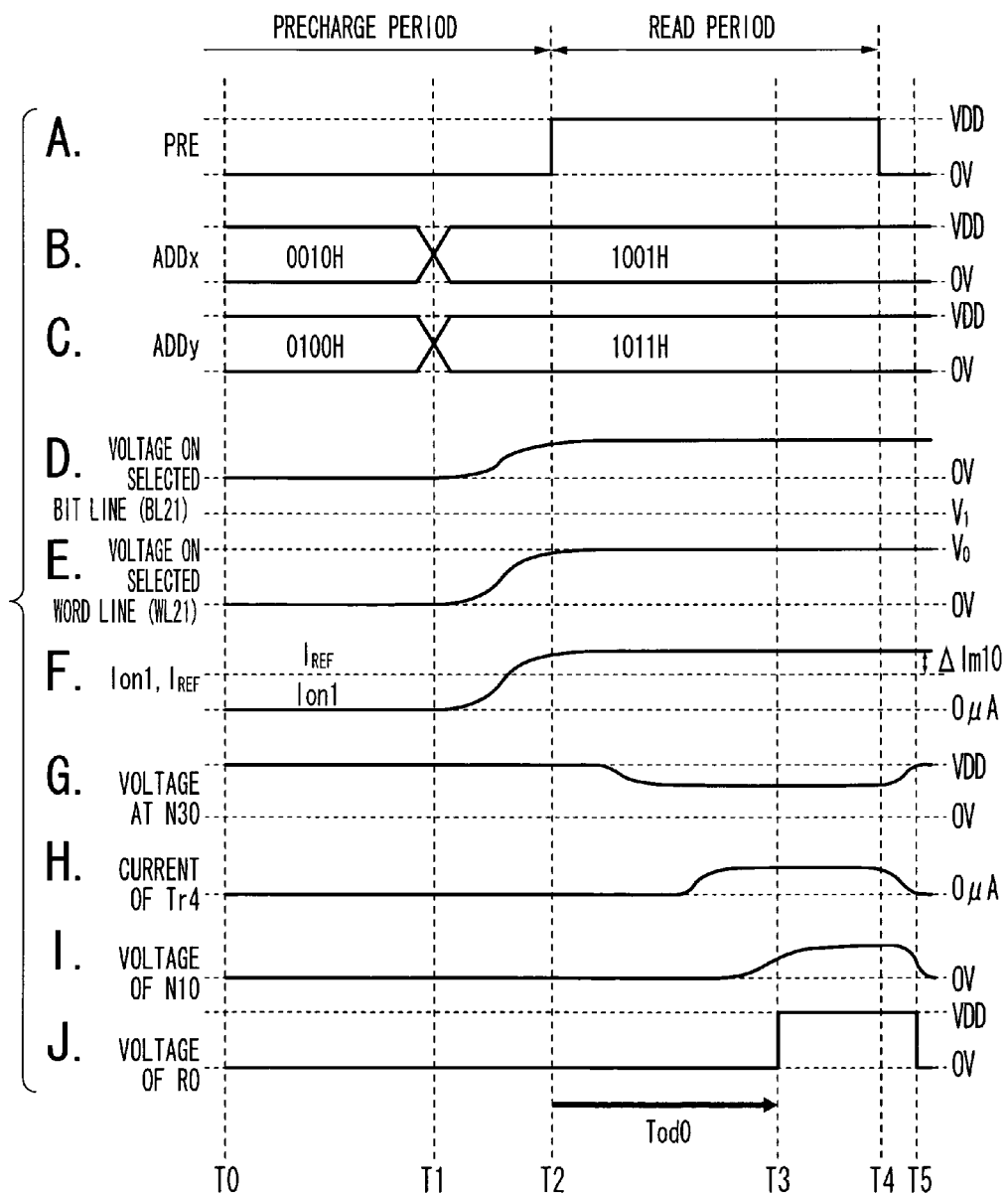
FIGS. 16A to 16J are timing charts showing other operations of the tester and the microcomputer upon a read operation of trimming data in case of the reset sequence.

FIG. 14 shows the configuration of a part of the sense amplifier circuit 67, a part of the memory array 65 connected with the amplifier circuit 67 and a part of the Y selector 66. Many memory cell transistors are contained in the memory array 65 and a circuit shown in FIG. 14 is needed for every memory cell transistors of a predetermined number. Thus, the word "part" is used.

It is supposed that the sense amplifier circuit 67 is composed of a plurality of sense amplifiers (like the sense amplifier circuit 4 described in the first embodiment), and the sense amplifier circuit 67 can be expressed as a sense amplifier group. The single sense amplifier is denoted with 67a in FIG. 14. Also, in FIG. 14, four memory cell transistors are shown as the memory cell transistors for the predetermined number. However, the number of memory cell transistors is not limited to four. It should be noted that the components shown in FIG. 8 in the first embodiment are assigned with the same reference numerals or symbols, and the same description is omitted.

The configuration of the sense amplifier circuit 67a is approximately the same as that of the FIG. 8 in the first embodiment. In FIG. 14, because the more detailed description is given, a precharge circuit 80 and a buffer circuit 81 are newly added. The precharge circuit 80 and the buffer circuit 81 are both well known to the person in the art. For example, the precharge circuit 80 is produced from PMOS transistors, and sets a node N30 voltage to a voltage as much as a power supply voltage VDD when the precharge signal PRE is "L". The buffer circuit 81 is composed of two inverters. Also, the mode signal MODE1 is supplied to one input of the NAND circuit. In the read mode, the mode signal MODE1 of "L" level (GND) is supplied and holds the wiring line YSO to a predetermined voltage through an NMOS transistor Tr5. As in case of FIG. 8, the NMOS transistor Tr1 may be contained n the sense amplifier circuit 67.

The sense amplifier circuit 67a is connected with the Y selector 66 through the wiring line YSO. In the Y selector 66, two switch circuits (for example, compose of NMOS transistors) are connected to one bit line BL. Whether the bit line BL should be connected with the wiring line YSO or the ground voltage is determined based on the Y selection signal SEL (YSEL0, YSEL0_B, YSEL_1, YSEL1_B in FIG. 14). Also, there are two bit lines of BL20 and BL21 as the bit lines BL to be connected with the Y selector 66 of FIG. 14. In FIG. 14, the bit lines BL20 and BL21 are connected with one memory cell transistor in the user area 65a and one memory cell transistor in the trimming data storage area 65b, respectively. It is supposed that the word lines WL and the source lines SL which are connected with these memory transistors WL20, WL21, SL20, and SL21. The sense amplifier circuit 67a compares the current $I_{on}$ flowing through the memory cell transistor connected with the selected word line WL and the selected bit line BL and the sense amplifier reference current (the reference current) $I_{REF}$ flowing based on the reference voltage $V_{REF}$. The voltage of a node N10 is determined from the magnitude relation and the read operation of the data stored in the memory cell transistor is carried out through the wiring line RO.

Next, the read operation of the trimming data at the time of the reset sequence will be described in detail with reference to FIG. 14, FIGS. 15A to 15J and FIGS. 16A to 16J.

FIGS. 15A to 15J are timing charts showing the read operation upon the reset sequence, that is, when the trimming data TCD and TCDR stored in the trimming data storage area after reset are read out. It should be noted that these timing charts show the read operation in which data is read out from an ON cell that electrons are not injected to a floating gate. The ON cell is in the state in which data "1" is written or in the erased state, and the threshold value is low so that ON current ($I_{on1}$) is large.

First, at the time t=T0, because it is the precharge period, the precharge signal PRE is set to the "L" level (0V). Therefore, the power supply and the node N30 are connected by the precharge circuit 80 and the node N30 is precharged to a voltage as much as the power supply voltage VDD.

At the time t=T1, the address signal ADD (ADDx, ADDy) outputted from the control section 60 is updated so that the X address signal ADDx is changed from 0010H to 1001 H, and the Y address signal ADDy is changed from 0100H into 1011 H. In FIG. 14, it is supposed that the memory cell transistor CELL_A is selected which is connected with the word line WL21 and the bit line BL21 based on the ADDx=1001H and the ADDy=1011H. Based on the updating of the Y address signal ADDy, it is set that YSEL1="H", YSEL0 = YSEL1_B="L", and YSEL0_B="H". As a result, the voltage of selection bit line BL21 raises to a predetermined voltage through the NMOS transistor Tr5 since the voltage is supplied from the precharge circuit 80 and whereas non-selected bit line BL20 is set to the ground voltage. Also, the read voltage $V_{read}$ is applied to the selected word line WL21 based on the updating of the X address signal ADDx. Because the read voltage $V_{read}$ in this case is generated by the read voltage generating circuit 61 in response to the trimming read signal Read_Trim of the "H" level outputted from the control section 60, the the read voltage $V_{read}$ can be used to read the data stored in the user area 65a, and is a voltage V1 higher than the voltage V0 in the state that the voltage control or voltage adjustment is not performed (an initial state in which a manufacturing deviation is contained. Hereinafter, the voltage V0 is merely referred to as a usual read voltage, and the voltage V1 is referred to as a higher read voltage. In other words, the usual read voltage V0 is in an adjustable voltage range based on the trimming data TCD stored in the trimming data storage area 65b (this contains a case that it is confirmed in the wafer test that there is not a manufacturing deviation and the trimming data TCD which means that any adjustment is unnecessary is stored). On the other hand, it is possible to say that the higher read voltage V1 has a voltage value which exceeds a maximum voltage in the adjustable voltage range based on the trimming data TCD stored in the trimming data storage area 65b.

In case of the read operation, because the source line SL is connected with the ground voltage, current flows through the memory cell transistor CELL_A to which voltages on the word line WL21 and the bit line BL21 are applied. Because the memory cell transistor CELL_A is the ON cell in which electrons are not injected, the current is the ON current $I_{on1}$.

This ON current $I_{on1}$ increases with the increase of the voltage of the selected word line WL21 and the voltage of the selected bit line BL21.

Finally, when the voltage applied to the word line WL21 is made larger, the ON current $I_{on1}$ is made larger. IN FIGS. 15A to 15J, because the read voltage $V_{read}$ applied to the selected word line WL21 is the higher read voltage V1, the current value of the ON current $I_{on1}$ becomes larger than at the time of the usual read voltage V0. In other words, the ON margin $\Delta_{Im11}$ which is a difference from the reference current $I_{REF}$ becomes larger.

At the time of t=2, when the precharge signal PRE changes to the "H" level, a supply source of voltage (current) to the node N30 changes from the precharge circuit 80 to the PMOS transistor Tr4. That is, when the precharge signal PRE changes into the "H" level, a current mirror circuit of the PMOS transistors Tr3 and Tr4 starts to operate and the control transfers from the precharge period to the read period. When the supply of the voltage (the current) from the precharge circuit 80 stops, the voltage of the node N30 starts to down rapidly. Then, because the node N30 is connected with the gate of the NMOS transistor Tr4, the voltage of the node N30 settles in the equilibrium state (in which the voltage change does not occur) at the voltage that the ON current $I_{on1}$ can be passed. That is, the current which flows through the PMOS transistor Tr4 becomes same as the ON current $I_{on1}$. Also, because the NMOS transistor Tr3 constitutes the current mirror circuit together with the NMOS transistor Tr4, the ON resistance of the PMOS transistor Tr3 changes such that the current which flows through PMOS transistor Tr4, namely, an current with the same value as the ON current $I_{on1}$ is supplied.

On the other hand, because the NMOS transistor Tr2 constitutes an current mirror circuit together with the NMOS transistor Tr1, the ON resistance of the NMOS transistor Tr2 changes such that current with the same value as the current, i.e., the reference current $I_{REF}$ which flows through the NMOS transistor Tr1 based on the reference voltage $V_{REF}$ is supplied.

The voltage of the node N10 is determined based on the relation in magnitude between the ON current $I_{on}$ and the reference current $I_{REF}$. In other words, in case of $I_{on}>I_{REF}$, because the PMOS transistor Tr3 tries to pass the current more than the PMOS transistor Tr2, the PMOS transistor Tr3 operates to reduce the ON resistance of the PMOS transistor Tr3. As a result, the voltage of the node N10 changes as it rises higher than a half of the power supply voltage VDD/2. On the other hand, in case of $I_{on}<I_{REF}$ because the NMOS transistor Tr2 operates to supply more current than the PMOS transistor Tr3, the ON resistance of the NMOS transistor Tr2 becomes small. As a result, the voltage of the node N10 changes as it downs lower than the half of the power supply voltage VDD/2. In FIGS. 15A to 15J, because the ON current $I_{on}$ is ON cell current $I_{on1}$ larger than the reference current $I_{REF}$, the voltage of the node N10 rises higher than the half of the power supply voltage VDD/2. In the precharge period, the voltage of the node N30 is equal to the power supply voltage VDD, that is, the OFF state is set that the current does not flow through the PMOS transistor Tr3, i.e., the ON resistance of the transistor is very high. Therefore, the voltage of the node N10 is in the neighborhood of 0 V. Thus, when the controls advances into the read period and the ON cell current $I_{on1}$ starts to flow through the PMOS transistor Tr4, the voltage of the node N10 rises from 0 V to a predetermined voltage higher than the half of the power supply voltage VDD/2 in conjunction with the above.

At the time of t=T3, the buffer circuit 81 operates and the voltage of the wiring line RO changes from the "L" level into the "H" level. Then, when a latch process of the read data ends, the precharge signal PRE changes to the "L" level again, and the control changes from the read period to the precharge period. Thus, the supply source of voltage (current) to the node N30 changes from the PMOS transistor Tr4 into the precharge circuit 80 and the voltage of the node N30 rises to the power supply voltage VDD. As a result, the current mirror circuit of the PMOS transistors Tr3 and Tr4 stops the operation and the current which flows through the PMOS transistor Tr4 becomes 0 µA and the voltage of the node N10 becomes 0 V. At the time of t=T5, the voltage of the wiring line RO becomes 0 V in response to the change of the voltage of the node N10.

In this case, an attention is paid to the output delay time $T_{od1}$ of the read data by the sense amplifier circuit 67 in FIGS. 15A to 15J. The time of the read start of data is t=T2, and at that time, the precharge signal PRE changes from "H" into "L". The time of the read end is t=T3, and at that time, the voltage of the wiring line RO changes from "L" to "H". Therefore, the output delay time $T_{od1}$ is as shown in FIGS. 15A to 15J.

The output delay time $T_{od}$ of the read data is related closely to the magnitude of $\Delta Im$ (the difference between $I_{on}$ and $I_{REF}$). When the ON current $I_{on}$ is large, the PMOS transistor Tr4 tries to pass the large current ($I_{on}$) after the precharge signal PRE changes into the "H" level. Therefore, the voltage of the node N30 rises more rapidly. When the voltage of the node N30 changes more rapidly, the ON resistance of the PMOS transistor Tr3 which is connected with the node N30 at the gate starts to change. In conjunction with this, the voltage of the node N10 changes, too. Also, when the difference between the ON current $I_{on}$ and the reference current $I_{REF}$ is larger, the PMOS transistors Tr3 and Tr4 operate such that the ON resistance of the NMOS transistor Tr2 becomes large and the ON resistance of the PMOS transistor Tr3 becomes small more rapidly. Therefore, the voltage of the node N10 rises more rapidly.

Inn FIGS. 15A to 15J, the read voltage $V_{read}$ applied to the word line WL21 is made larger (it is set to the higher read voltage V1) such that an enough ON margin of the ON cell current $I_{on1}$ to the reference current $I_{REF}$ can be given, that is, $\Delta_{Im11}=I_{on1}-I_{REF}$ becomes larger. Therefore, it becomes possible that read data delay time $T_{od1}$ is made sufficiently small. For example, when the reference current is $I_{REF}=10$ µA, about 3.0 V is applied to the selected word line WL21 as the higher read voltage V1, and the ON cell current $I_{on1}$ of about 14 µA flows, the read data delay time $T_{od1}$ is 50 ns. In this case, even when the read time condition in the reset sequence is set to 100 ns for the product specification, the condition can be satisfied sufficiently. Also, the trimming data TCD and TCDR can be correctly read out within the preset time.

FIGS. 16A to 16J are timing charts showing the read operation of the trimming data in the reset sequence. Similarly to FIGS. 15A to 15J, the read operation to the ON is shown, but the read voltage $V_{read}$ is the usual read voltage V0 and is not set to the higher read voltage V1.

The basic operation is similar to that shown in FIGS. 15A to 15J, and the description is omitted. The different points from FIGS. 15A to 15J are in the magnitude of the read voltage $V_{read}$ and the value of ON cell current $I_{on1}$. The ON current $I_{on}$ becomes larger as the voltage applied to the word line WL becomes larger. Therefore, in FIGS. 16A to 16J, the ON cell current $I_{on1}$ is smaller than that of the higher read voltage V1. As a result, the ON margin $\Delta_{Im10}$ as a difference between the ON cell current $I_{on1}$ and the reference current $I_{REF}$ becomes smaller, as shown in FIGS. 16A to 16J, and it is satisfied that $\Delta_{Im10}<\Delta_{Im11}$.

On contrary to a case of FIGS. 15A to 15J, when the ON margin $\Delta_{Im1}$ as the difference between the ON current $I_{on}$ and the reference current $I_{REF}$ is small, the read data delay time $T_{od}$ becomes larger. Referring to FIGS. 16A to 16J, because the ON cell current $I_{on1}$ is small, the change of the voltage of the node N30, the change of the current flowing through the PMOS transistor Tr4, and the change of the voltage of the node N10 becomes slow, respectively. In other words, the operation speed of the semiconductor device becomes slow. As a result, the time necessary for the voltage of the wiring line RO changes to change from "L" into "H" becomes very long. Therefore, a time period from the read start (t=T2) to the read end (t =T3), i.e., the read data delay time $T_{od0}$ becomes long. Comparing with the read data delay time $T_{od1}$ shown in FIGS. 15A to 15J, it is $T_{od0}>T_{od1}$ clearly. For example, when the reference current is $I_{REF}$=10 µA, about 2.4 V is applied as the usual read voltage V0 to the selected word line WL21 and the ON cell current $I_{on1}$ flows by the about 12 µA, the read data delay time $T_{od0}$ is 200 ns. In this case, when the read data delay time in the reset sequence is defined to be 100 ns in the product specification, the value cannot be satisfied and the read data delay time of the trimming data TCD and TCDR in the reset sequence cannot be carried out correctly within the set time.

In this way, in FIGS. 16A to 16J that the read operation is carried out in the read voltage $V_{read}$=V0 in the reset sequence, i.e., in the conventional example, there is a case that the trimming data TCD and TCDR cannot be read out within a predetermined time which is defined in the specification in the reset sequence. In such a case, if it is possible to read the trimming data TCD and TCDR, the manufacturing deviation can be trimmed. Even if the subsequent read operation can be carried out in the optimal condition, the product must be treated as a defective product.

However, in the present invention, that is, in FIGS. 15A to 15J that the read operation is carried out in the read voltage $V_{read}$=V1 in the reset sequence, the trimming data TCD and TCDR cannot be read out within a predetermined time defined in the specification in the reset sequence under the condition of the read voltage $V_{read}$=V0. However, by changing the read voltage $V_{read}$ from the usual read voltage V0 to the higher read voltage V1, the trimming data TCD and TCDR can be correctly read out within the predetermined time. As a result, according to the present invention, the products in which the read operation of the trimming data TCD and TCDR is failed in the read voltage $V_{read}$=V0, i.e., which are determined to be defective products, can be handled as products of good quality.

Figure 17:
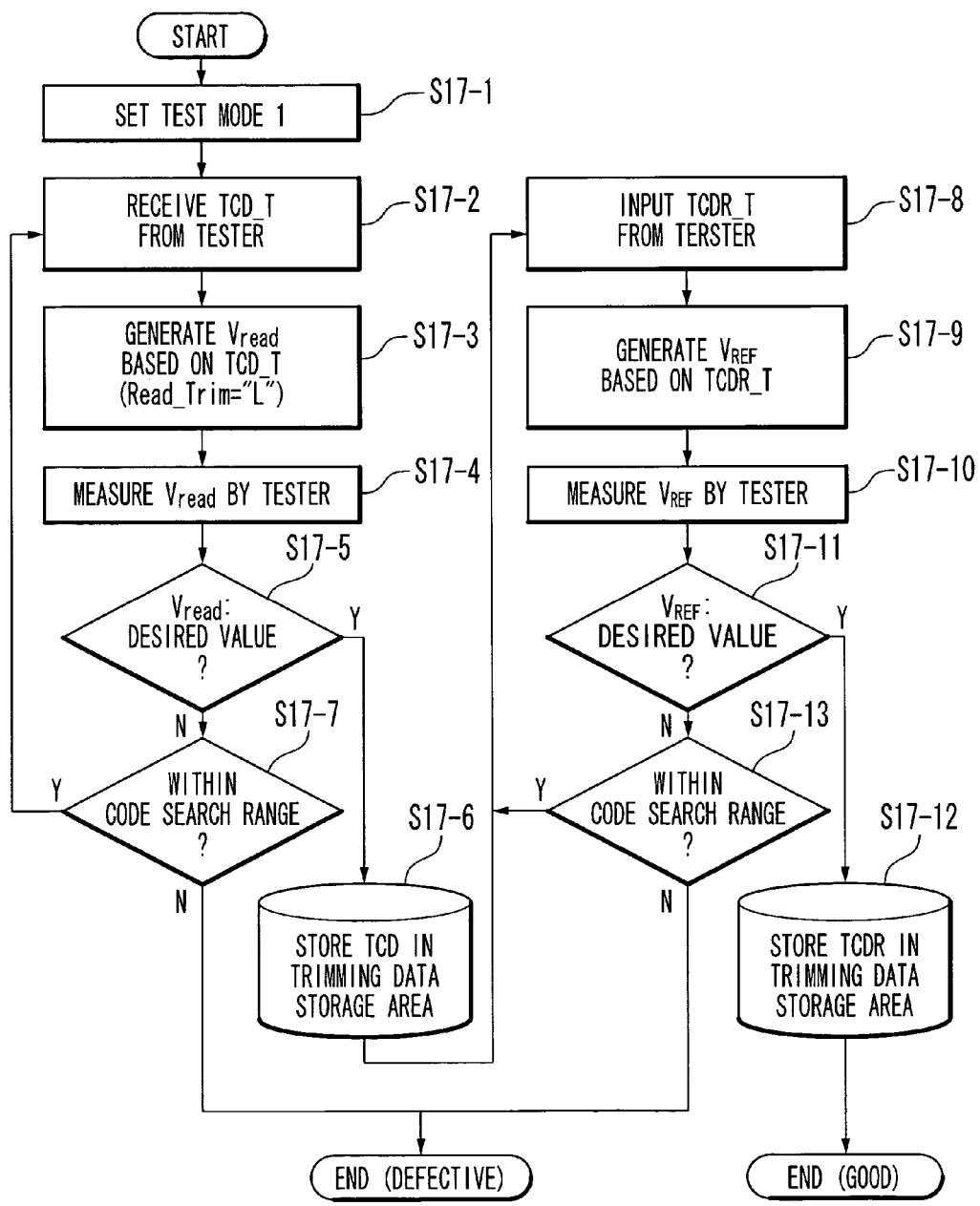
FIG. 17 is a flow chart showing operations of the tester and the microcomputer upon the read operation of trimming data in case of the reset sequence.
Figure 18:
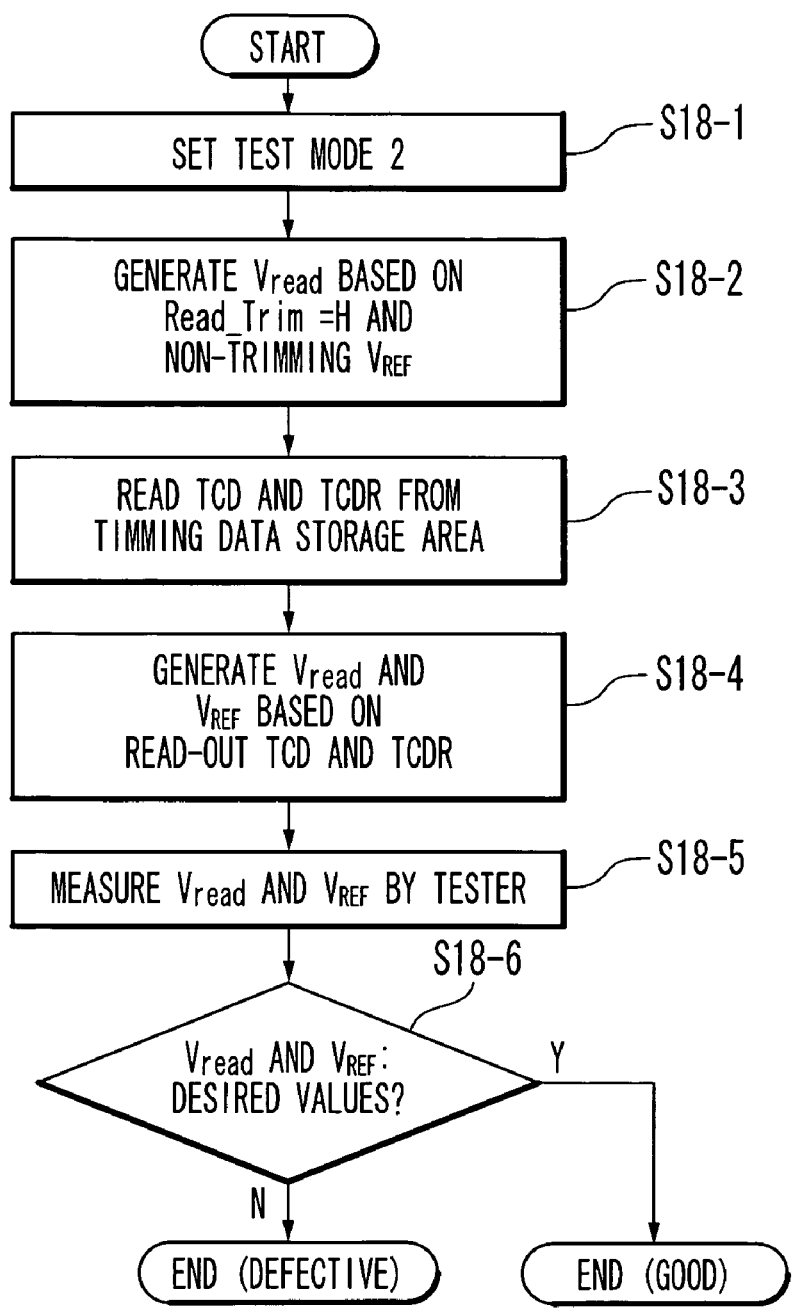
FIG. 18 is a flow chart showing other operations of the tester and the microcomputer upon the read operation of trimming data in case of the reset sequence.

Subsequently, the detail of a wafer test to the product of good quality/the defective product will be described with reference to FIG. 17 and FIG. 18. In the flow shown in FIG. 17, the trimming data TCD and TCDR to store in the trimming data storage area 65b are determined. The test for determining this trimming data TCD and TCDR is executed based on a control signal CTL_SIG from the tester 90.

First, the control signal CTL_SIG is supplied to the control section 60 through the input terminal 56 of the microcomputer 50 from the output terminal 92 of the tester 90 at the step S17-1. The microcomputer 50 is set to a test mode 1 (the test operation mode of determining the trimming data TCD and TCDR and of storing them in the storage area).

Next, at a step S17-2, the trimming data TCD_T for the test is supplied to the control section 60 through the input terminal 57 of the microcomputer 50 from the output terminal 93 of the tester 90.

Next, at a step S17-3, the control section 60 outputs the trimming data TCD_T for the test to the read voltage generating circuit 61. At this time, a trimming read signal Read_Trim is set to the trimming "L" level. The read voltage generating circuit 61 generates the read voltage $V_{read}$ based on the trimming data TCD_T.

Next, the read voltage $V_{read}$ is outputted to the input terminal 91 of the tester 90 through the output terminal 55 of the microcomputer 50 at the step S17-4. The tester 90 measures the magnitude of the inputted read voltage $V_{read}$.

Next, at a step 17-5, the tester 90 checks whether the measured read voltage $V_{read}$ is a desired value, i.e., a manufacturing deviation is a corrected expectation. When the measured read voltage $V_{read}$ is a desired value, it is possible to determine that the test trimming data TCD_T received at the step S17-2 is appropriate as the data (code) which trims a manufacturing deviation. Then, the control advances to a step S17-6. On the other hand, at the step S17-6, when the measured read voltage $V_{read}$ is not the desired value, it is possible to determine that the test trimming data TCD_T received at the step S17-2 is not appropriate as the data (code) which trims the manufacturing deviation. Then, the control advances towards step S17-7. It should be noted that the tester 90 must hold the desired value to compare with previous measured read voltage $V_{read}$.

In a step S17-6, because the trimming data TCD which should be stored in the trimming data storage area 65b is determined, the tester 90 outputs a control signal CTL_SIG to instruct the test trimming data TCD_T set in the read voltage generating circuit 61 at present to be stored in the trimming data storage area 65b to the control section 60 through the output terminal 92. The control section 60 receives the control signal CTL_SIG and executes the write (storage) operation of the trimming data TCD into the trimming data storage area 65b. Thus, the storage of the trimming data TCD to trim the read voltage $V_{read}$ is completed.

On the other hand, at the step S17-7, the determination of whether or not the area is in the code search range is carried out by tester 90. That is, the measured read voltage $V_{read}$ shifts from the desired value greatly, it is not possible to carry out a trimming of the read voltage $V_{read}$ into the desired value (because a trimming range is determined depending on the resistance value in the read voltage generating circuit 61, the trimming cannot be carried out when exceeding the trimming range), even if the trimming data TCD is changed. Because the tester 90 has previously stored the trimming range in which the read voltage $V_{read}$ can be trimmed based on the trimming data TCD, it is confirmed whether or not the difference from the measured read voltage $V_{read}$ and the desired value can be set in the trimming range. As a result, when the difference is in the range, i.e., when the read voltage $V_{read}$ can be trimmed by changing the trimming data, the control returns to the step S17-2. Then, the test trimming data TCD_T is updated and measurement of the read voltage $V_{read}$ is carried out. On the other hand, when the difference is out of the range, that is, when it is impossible to carry out the trimming of the read voltage $V_{read}$ even if the trimming data is changed, the product is determined to be a defective product. Then, the test is ended.

At the step S17-6, after the storage of the trimming data TCD is complete, the control transfers to a step S17-8 and the subsequent. Continuously, the trimming data TCDR to trim the reference voltage $V_{REF}$ is determined and the storage is carried out. Basically, a same procedure as in a case of the read voltage $V_{read}$ is executed.

At the step S17-8, the test trimming data TCDR_T is received by the control section 60 through the input terminal 57 of the microcomputer 50 from the output terminal 93 of the tester 90.

Next, at a step S17-9, the control section 60 outputs the test trimming data TCDR_T to the reference voltage generating circuit 62. The reference voltage generating circuit 62 generates the reference voltage $V_{REF}$ based on the trimming data TCDR_T.

Next, the reference voltage $V_{REF}$ is outputted to the input terminal 94 of the tester 90 through the output terminal 58 of the microcomputer 50 at a step S17-10. The tester 90 measures the voltage magnitude of inputted reference voltage $V_{REF}$.

Next, at a step 17-11, the tester 90 determines whether the measured reference voltage $V_{REF}$ is the desired value, or an expectation in which the manufacturing deviation is corrected. When the measured reference voltage $V_{REF}$ is the desired value, it is possible to determine that the test trimming data TCDR_T received at a step S17-8 is appropriate as the data (code) which trims a manufacturing deviation. Then, the control advances to the step S17-12. On the other hand, when the measured reference voltage $V_{REF}$ is not the desired value, it is possible to determine that the test trimming data TCDR_T received at a step S17-9 is not appropriate as the data (code) which trims a manufacturing deviation. Then, the control advances to a step S17-13. It should be noted that the tester 90 must previously store the desired value to the reference voltage $V_{REF}$, similar to a case of the read voltage $V_{read}$.

Because the trimming data TCD_R which should be stored in the trimming data storage area 65b is determined at the step S17-12, the tester 90 outputs the control signal CTL_SIG to instruct the test trimming data TCDR_T set in the reference voltage generating circuit 62 at present to be stored in the trimming data storage area 65b to the control section 60 through the output terminal 92. The control section 60 receives the control signal CTL_SIG and executes the write (storage) operation of the trimming data TCDR to the trimming data storage area 65b. Thus, the storage of the trimming data TCDR to the trim the reference voltage $V_{REF}$ is completed. As a result, because the trimming data TCD and TCDR which corrects a manufacturing deviation could be stored in the trimming data storage area 65b, it ends a series of test operations as the product of good quality.

On the other hand, at the step S17-13, the determination of whether or not the measured reference voltage $V_{REF}$ is in the code search range by the tester 90 carried out. That is, when the measured reference voltage $V_{REF}$ shifts from the desired value greatly, it is impossible to carry out the trimming operation of the reference voltage $V_{REF}$ to the desired value, even if the trimming data TCDR is changed. Because the tester 90 previously stores a range in which the reference voltage $V_{REF}$ can be trimmed by using the trimming data TCDR, the confirmation is carried out of whether the difference between the measured reference voltage $V_{REF}$ and the desired value is in the trimming range. As a result, in case that are in the range, i.e., in case that the trimming of the reference voltage $V_{REF}$ is possible by changing the trimming data, the control returns to the step S17-9. Also, the test trimming data TCDR_T is updated and the reference voltage $V_{REF}$ outputted from the reference voltage generating circuit 62 once again. On the other hand, it is determined to be a defective product and it ends the test in case of being outside the range, i.e. in case that it is impossible to carry out trimming to the reference voltage $V_{REF}$ even if the trimming data is changed.

In this way, first, the first half of the wafer test or a test for determining and storing the trimming data TCD and TCDR is executed by the tester 90. As the following step, the second half of the wafer test or a test of whether the stored trimming data TCD and TCDR can read out correctly is carried out. FIG. 18 is a flow chart showing a procedure of the test.

First, at a step S18-1, the control signal CTL_SIG is supplied from the output terminal child 92 of the tester 90 to the control section 60 through the input terminal 56 of the microcomputer 50. The microcomputer 50 is set to a test mode 2 (a test operation mode about the read operation of the trimming data TCD and TCDR).

Next, at a step S18-2, the control section 60 outputs the trimming read signal Read_Trim of the "H" level to the read voltage generating circuit 61. The read voltage generating circuit 61 generates the read voltage $V_{read}$ based on the trimming read signal Read_Trim, i.e., the higher read voltage V1 to apply to the word line WL in the reset sequence. Also, the control section 60 outputs the trimming data TCDR (the initial value) to the reference voltage generating circuit 62. The reference voltage generating circuit 62 generates the reference voltage $V_{REF}$ (or the reference voltage $V_{REF}$ to which a trimming is not carried out because there is no trimming data TCDR and which has a manufacturing deviation) based on the trimming data TCDR (the initial value).

Next, at a step S18-3, the control section 60 outputs a mode signal MODE1-3, the address signal ADD (ADDx, ADDy), the precharge signal PRE to read the trimming data TCD and TCDR which are stored in the trimming data storage area 65b. It should be noted that the address signal ADD (ADDx, ADDy) showing the locations of the trimming data TCD and TCDR is stored in the memory 71 of the control section 60. Also, the read operation at the step S18-2 and the step S18-3 is the same as the above-mentioned read operation in the reset sequence and the read time is the same as the time defined in the specification in the reset sequence.

Next, at a step S18-4, the control section 60 receives the trimming data TCD and TCDR read out from the trimming data storage area 65b through the trimming register section 68. The read trimming data TCD is outputted to the read voltage generating circuit 61 and the trimming data TCDR is outputted to the reference voltage generating circuit 62. The trimming read signal Read_Trim outputted from the control section 60 at this time is set to "L" level. The read voltage generating circuit 61 generates the read voltage $V_{read}$ based on the received trimming data TCD. Also, the reference voltage generating circuit 62 generates the reference voltage $V_{REF}$ based on the received trimming data TCDR.

Next, at a step S18-5, the read voltage $V_{read}$ is outputted to the input terminal 91 of the tester 90 through the output terminal child 55 of the microcomputer 50. The tester 90 measures the magnitude of the received read voltage $V_{read}$. Also, the reference voltage $V_{REF}$ is outputted to the input terminal 94 of the tester 90 through the output terminal 58 of the microcomputer 50. The tester 90 measures the magnitude of the inputted reference voltage $V_{REF}$.

Next, at a step 18-6, the tester 90 determines whether or not the measured read voltage $V_{read}$ and reference voltage $V_{REF}$ are the desired values, or expectation values in which the manufacturing deviation is corrected. When the both voltages are predetermined values, the product is determined to be a good product and the test is ended. Also, when at least one of the measured voltages is not the desired value, that is, when at least one of the trimming data cannot be read out within a predetermined time, the product is determined to be a defective product and the test is ended.

In the conventional test of the read operation of the trimming data TCD and TCDR, not the higher the read voltage V1 but the usual the read voltage V0 is used as the read voltage $V_{read}$. All the products in which the trimming data TCD or TCDR cannot be read out in this test are determined to be the defective products. On the other hand, in the present invention, the higher the read voltage V1 is used as the read voltage $V_{read}$ for reading out the trimming data TCD and TCDR. Therefore, the trimming data TCD and TCDR can be read out in more products because the ON cell current $I_{on1}$ is made larger. Most of the products conventionally determined as the defective products are determined to be good products. That is, the products which are good products if the trimming data TCD and TCDR can be read out within a predetermined time can be actually determined to be good products.

As described above, according to the second embodiment of the present invention, the influence of the manufacturing deviation of the read voltage $V_{read}$ and the reference current $I_{REF}$ can be suppressed by increasing the read voltage $V_{read}$ even if the ON current $I_{on}$ became small so that the influence becomes large, like the first embodiment of the present invention. Specifically, when the reference current $I_{REF}$ shifts to the higher side, a difference from the ON cell current $I_{on1}$ becomes small so that the trimming data read delay time becomes longer, if the trimming data TCD and TCDR is read out by using the usual the read voltage V0 (substantially the same voltage as the voltage used at the time of the read operation to the user area 65a). As a result, the trimming data TCD and TCDR cannot be read out within the predetermined time prescribed in the reset sequence and the products are treated as the defective products. However, in the second embodiment of the present invention, the higher voltage V1 (the voltage which is higher than the voltage used at the time of the read operation to the user area 65a) is used as the read voltage $V_{read}$ to read the trimming data TCD and TCDR so that the ON cell current $I_{on1}$ is made larger. As a result, the trimming data TCD and TCDR can be read out correctly within the predetermined time prescribed in the reset sequence, and the products which were conventionally treated as the defective products are treated as the good products. It should be noted that the higher voltage V1 which is used as the read voltage $V_{read}$ to read out the trimming data TCD and TCDR is not preferable from the viewpoint of the read disturbance, as described in the first embodiment of the present invention. However, because the number of times to access to the trimming data storage area 65b is extremely less than the number of times to access to the user area 65a, there is no read disturbance problem, when a lifetime access time is considered.

Embodiment 3

When the trimming data TCD and TCDR are read out in the reset sequence, only the read voltage $V_{read}$ is set to the higher voltage, in the first and embodiments of the present invention. However, in the third embodiment of the present invention, the reference voltage $V_{REF}$ (the reference current $I_{REF}$) is made larger or higher, too.

Figure 19:
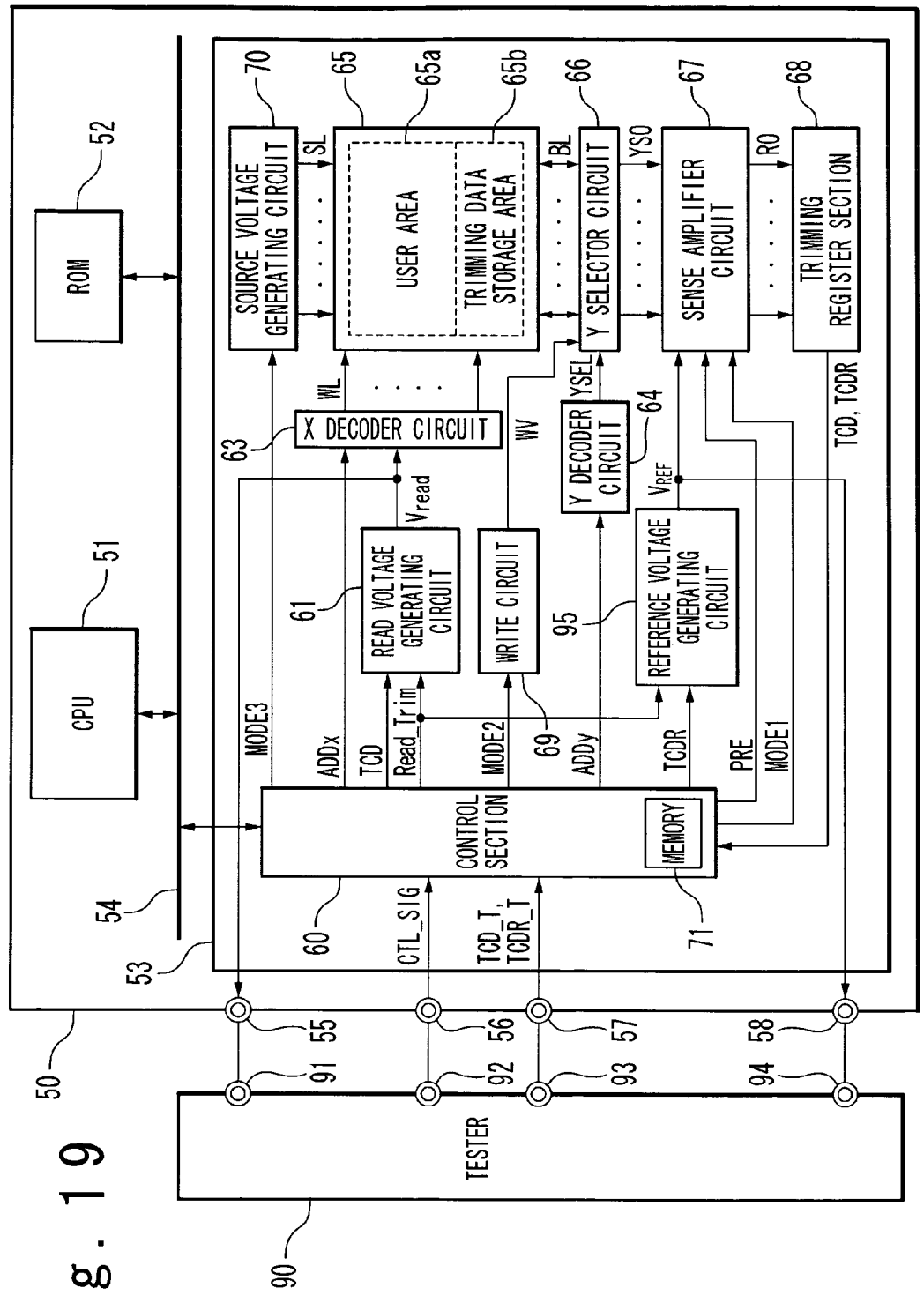
FIG. 19 is a block diagram showing the configuration of the tester and the microcomputer according to a third embodiment of the present invention.

FIG. 19 is a block diagram showing the configuration of the tester and the microcomputer connected with the tester according to third embodiment. The third embodiment will be described to be combined with the microcomputer 50 in the second embodiment but it would be possible to be combined with the first embodiment. It should be noted that the same blocks as in the second embodiment are assigned with the same reference numerals and symbols, and the description is omitted.

In FIG. 19, the points different from the block diagram of the second embodiment shown in FIG. 13 are in the configuration of the reference voltage (current) generating circuit 95 and in that the trimming read signal Read_Trim outputted from the control section 60 is supplied to the reference voltage generating circuit 95 in addition to the read voltage generating circuit 61. The other points are same as those in the second embodiment.

Figure 20:
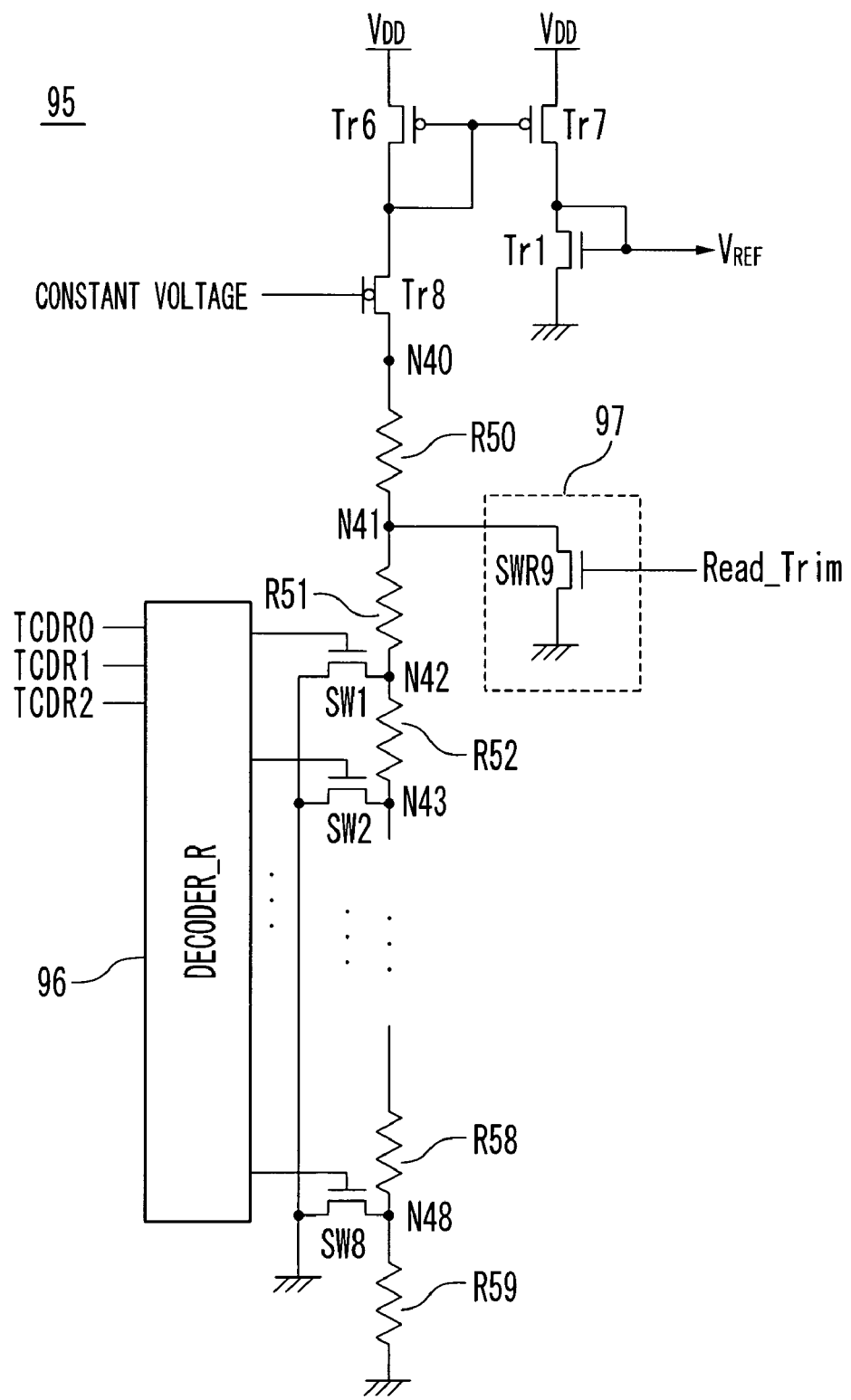
FIG. 20 is a circuit diagram showing a configuration of a reference voltage generation circuit in the tester and the microcomputer according to the third embodiment of the present invention.

FIG. 20 shows an example of the circuit configuration of the reference voltage generating circuit 95. The reference voltage generating circuit 95 is composed of an NMOS transistor Tr1 for supplying the reference voltage $V_{REF}$ to the sense amplifier circuit 67, PMOS transistors Tr6 and Tr7 constituting an current mirror circuit, a non-dope type NMOS transistor Tr8 connected with one end of PMOS transistor Tr6, resistances R50 to R59, switch circuits SWR1 to SW9, a decoder R96 and a current changing circuit 97.

The NMOS transistor Tr1 is connected with the NMOS transistor Tr2 in the sense amplifier circuit 67 to constitute a current mirror circuit, as described with reference to FIG. 14, and supplies the sense amplifier circuit 67 with the reference voltage $V_{REF}$ (the reference current $I_{REF}$).

The PMOS transistor Tr6 constitutes the current mirror circuit together with PMOS transistor Tr7 such that same current as the current flowing through the PMOS transistor Tr6 flows through the PMOS transistor Tr7. One end of the PMOS transistor Tr6 is connected with the power supply (the power supply voltage VDD), and the other end thereof is connected with the non-dope type NMOS transistor Tr8. Also, one end of the PMOS transistor Tr7 is connected with the power supply (the power supply voltage VDD) and the other end thereof is connected with the NMOS transistor Tr1.

The non-dope type NMOS transistor Tr8 is connected with the PMOS transistor Tr6 and the resistance 50 in the drain and the source. Also, a signal of a constant voltage outputted from a constant voltage generating circuit (e.g., a band gap reference circuit and now shown) is supplied to the gate. Therefore, the non-dope type NMOS transistor Tr8 keeps the voltage of the node N40 constant (keeping the voltage to the same voltage as the constant voltage supplied to the gate).

The resistances R50 to R59 are connected in series, and one ends of R50 and R59 are connected with the non-dope type NMOS transistor Tr8 and the ground voltage, respectively. Also, the current changing circuit 97 is connected between the resistances R50 and R51 (with a node N41) and the respective switch circuit SWR1 to SWR8 are connected with nodes N42 to N48, each of which is a node between adjacent two of the resistances R51 to R59. For example, the switch circuits SWR1 to SWR8 are formed from NMOS transistors, and one end of each switch is connected with the resistance and the other end is connected with the ground voltage. Also, a gate thereof is connected with the decoder R96 and one of signals obtained by decoding the trimming data TCDR0-2 by the decoder R96 is connected with the gate. The current changing circuit 97 is composed of a switch circuit SWR9. For example, the switch circuit SWR9 is composed of an NMOS transistor. A drain and a source thereof are connected with a resistance and the ground voltage, and a trimming read signal Read_Trim is connected with a gate thereof. It should be noted that it is supposed that the trimming data TCDR is 3-bit data, but the present invention is never limited to this.

The basic configuration and operation of a circuit which is composed of the resistances R50 to R59, the switch circuits SWR1 to SWR8, the decoder R96, and the current changing circuit 97 are same as those of the read voltage generating circuit 61 shown in FIG. 6. In other words, in this circuit, the switch circuits SWR1 to SWR8 are controlled through the decoder R96 based on the trimming data TCDR0-2. The connection and disconnection of the resistances R52 to R59 changes the resistance value connected with the resistance R51 and the subsequent. Thus, the current which flows through the PMOS transistor Tr6 changes and it is possible to change (fine adjust) a value of the reference voltage $V_{REF}$ (reference current $I_{REF}$). Also, when the trimming read signal Read_Trim of the "H" level is outputted in the reset sequence (when the read operation to the trimming data storage area 65b is carried out) and supplied to the current changing circuit 97, the resistance value shifts to a smaller state because the switch circuit SWR9 is turned on to connect the node N41 to the ground voltage. As a result, the current which flows through the PMOS transistor Tr6 becomes very large, and in conjunction with this, the reference voltage $V_{REF}$ (the reference current $I_{REF}$) becomes very large. That is, the reference current $I_{REF}$ is generated to have a current value which exceeds an adjustable current range based on the trimming data TCDR stored in the trimming data storage area 65b.

Figure 3:
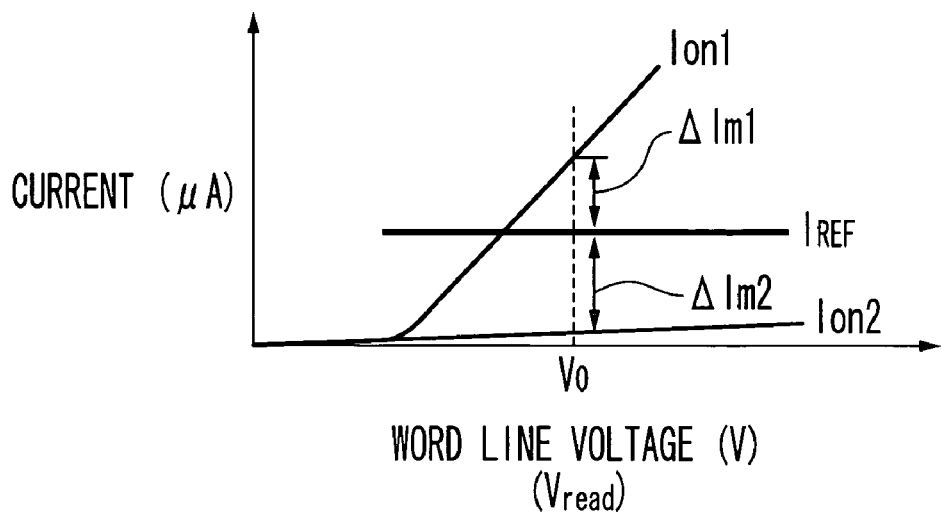
FIG. 3 is a graph showing a relationship between read voltage, and cell current and sense amplifier reference current in the conventional nonvolatile memory.

In the first and second embodiments, the attention is mainly paid to the magnitude of the ON margin $\Delta I_{m1}$ as a difference between the ON cell current $I_{on1}$ and the reference current $I_{REF}$. Even when the reference current $I_{REF}$ shifts largely to the higher side than the expectation (the value in case of no manufacturing deviation and being as the design) due to the manufacturing deviation, an appropriate ON margin can be secured by increasing the read voltage $V_{read}$. However, there is a case that the reference voltage $I_{REF}$ shifts mainly to the smaller side due to the manufacturing deviation. In that case, when the read voltage $V_{read}$ to be applied to the word line WL is increased, the OFF margin $\Delta I_{m2}$ as a difference between the reference current $I_{REF}$ and the OFF cell current $I_{on2}$ becomes small. The current change (inclination) to the read voltage $V_{read}$ is small the OFF cell current $I_{on2}$, compared with the ON cell current $I_{on1}$, as shown in FIGS. 3, 4 and 10. A problem of the OFF margin $\Delta I_{m2}$ as a difference from the OFF cell current $I_{on2}$ is caused as the miniaturization progresses, a constant voltage move operation progresses, and the manufacturing deviation increases. Therefore, in the third embodiment of the present invention, the attention is paid on that point, and it becomes possible to cope with a situation when the reference current $I_{REF}$ shifts mainly to the smaller side due to the manufacturing deviation. That is, in the reset sequence, the reference current $I_{REF}$ is shifted to the upper side based on the trimming read signal Read_Trim and the read operation of the trimming data TCD and TCDR is carried out. Thus, the OFF margin $\Delta I_{m2}$ as a difference between the reference current $I_{REF}$ and the OFF cell current $I_{on2}$ can be sufficiently secured and the trimming data TCD and TCDR to the OFF cell can be correctly read out within the predetermined time.

It should be noted that the read operation of the trimming data TCD and TCDR in which the reference current $I_{REF}$ is shifted to the upper side means that the ON margin $\Delta I_{m1}$ as a difference between the ON cell current $I_{on1}$ and the reference current $I_{REF}$ becomes small, i.e., the data read from the ON cell becomes difficult. However, in the third embodiment, because the read voltage $V_{read}$ is made large at the same time, it could be thought that the ON cell current $I_{on1}$ becomes large sufficiently (the ON margin $\Delta I_{m1}$ is secured sufficiently). Therefore, a problem is not cause that the data read from the ON cell cannot be carried out. However, when it is previously known that it is easy for the reference current $I_{REF}$ to shift to the smaller side due to any factors, it is not necessary to combine with the first and second embodiments. That is, it is not necessary to increase the read voltage $V_{read}$ (use the higher read voltage V1) and only the reference current $I_{REF}$ may be increased.

As described above, the present invention has been described in detail based on the above embodiments. However, the present invention can be attained as various modifications without changing the scope of the present invention.

What is claimed is:

1. A nonvolatile semiconductor memory device comprising:
   a plurality of nonvolatile memory cells for a user area and a trimming data storage area; and
   a plurality of word lines,
   wherein:
   a first trimming data is stored in said trimming data storage area, and is for adjusting a read voltage to be applied to a selected word line as one of said plurality of word lines in a read operation, and
   said read voltage is set to a voltage which exceeds a maximum voltage in an adjustable voltage range based on said first trimming data when said read operation is carried out to said trimming data storage area, and
   said first trimming data is read by using said read voltage which exceeds said maximum voltage.

2. The nonvolatile semiconductor memory device according to claim 1, further comprising:
   a sense amplifier configured to read a data based on a cell current which flows through said nonvolatile semiconductor memory cell and a reference current,
   wherein a second trimming data to adjust said reference current is stored in said trimming data storage area,
   said reference current is set to a current which exceeds a maximum current in an adjustable current range based on said second trimming data when said read operation is carried out to said trimming data storage area.

3. The nonvolatile semiconductor memory device according to claim 1, further comprising:
   a control section configured to generate a trimming read signal when the read operation is carried out to said trimming data storage area; and
   a read voltage generating circuit comprising first to third resistances connected in series and first and second switch circuits, and configured to generate said read voltage in response to said first trimming data and said trimming read signal,
   wherein said first switch circuit connects a first node between said first resistance and said second resistance to a ground voltage in response to said first trimming data, and
   a second switch circuit connects a second node between said second resistance and said third resistance to the ground voltage in response to said trimming read signal.

4. The nonvolatile semiconductor memory device according to claim 2, further comprising:
   a control section configured to generate a trimming read signal when the read operation is carried out to said trimming data storage area; and
   a read voltage generating circuit comprising first to third resistances connected in series and first and second switch circuits, and configured to generate said read voltage in response to said first trimming data and said trimming read signal,
   wherein said first switch circuit connects a first node between said first resistance and said second resistance to a ground voltage in response to said first trimming data, and
   a second switch circuit connects a second node between said second resistance and said third resistance to the ground voltage in response to said trimming read signal.

5. A nonvolatile semiconductor memory device comprising:
   a memory cell array having a plurality of nonvolatile memory cells;

a sense amplifier circuit configured to read a data from a selected memory cell which is selected from said plurality of nonvolatile memory cells based on a cell current and a reference current;

wherein:

said cell current flows through said selected memory cell and a bit line which is connected with said selected memory cell, based on a read voltage applied to a word line connected with said selected memory cell, a read voltage generating circuit configured to generate a first read voltage such that said cell current becomes larger than in a read operation from any of nonvolatile memory cells, in which a trimming data is not stored, of said plurality of nonvolatile memory cells, when said trimming data is read by using said first read voltage that exceeds a maximum voltage from said nonvolatile memory cells, in which said trimming data is stored, of said plurality of nonvolatile memory cells.

6. The nonvolatile semiconductor memory device according to claim 5, wherein said read voltage generating circuit generates said first read voltage higher than a second read voltage used to read another data when said selected memory cell is in a relatively low threshold voltage state, if a difference between said cell current and said reference current is less than a first current value as a lower limit current which said sense amplifier circuit can sense when to read said trimming data, in case of the read operation of said trimming data.

7. The nonvolatile semiconductor memory device according to claim 6, wherein said read voltage generating circuit comprises:

a reference word line voltage generating circuit configured to generate a second read voltage;

a first voltage changing circuit connected with said reference word line voltage generating circuit and configured to adjust an output of said reference word line voltage generating circuit to said first read voltage.

8. The nonvolatile semiconductor memory device according to claim 7, wherein said reference word line voltage generating circuit comprises:

an output stage transistor whose one end is connected with a constant voltage source and whose other end is connected to an output node, from which an output voltage is outputted;

a plurality of first resistances connected in series to form a series connection, and configured to resistance-divide a constant voltage supplied from said constant voltage source, wherein one end of said series connection is connected said output node;

an error amplification circuit configured to control a gate of said output stage transistor such that a difference between a first division voltage and said reference voltage is removed based on said first division voltage obtained from said constant voltage and said plurality of first resistances and said reference voltage; and a first selecting circuit configured to select one of said plurality of first resistances to be used for the resistance division based on said trimming data, and said first voltage changing circuit comprises a first switch whose one end is connected with a midway of said series connection, whose the other end is connected with the ground voltage, and which is turned on when said trimming data is read out.

9. The nonvolatile semiconductor memory device according to claim 5, further comprising:

a reference current generating circuit configured to generate said reference current such that said reference current becomes larger than in the read operation from said nonvolatile memory cells, in which said trimming data is not stored, in the read operation of said trimming data.

10. An operation method of a nonvolatile semiconductor memory device, which has a plurality of nonvolatile memory cells for a user area and a trimming data storage area, and a plurality of word lines, comprising:

storing a first trimming data in said trimming data storage area to adjust a read voltage to be applied to a selected word line of said plurality of word lines in a read operation;

setting said read voltage to a voltage which exceeds a maximum voltage in an adjustable voltage range based on said first trimming data when the read operation is carried out to said trimming data storage area; and applying said read voltage to said selected word line and executing the read operation to said trimming data storage area, wherein said first trimming data is read by using said read voltage which exceeds said maximum voltage.

11. The operation method according to claim 10, wherein said nonvolatile semiconductor memory device comprises a sense amplifier configured to read a data based on a cell current and a reference current which flows through one of said plurality of nonvolatile memory cells connected with said selected word line, a second trimming data to adjust said reference current is stored in said trimming data storage area, said operation method further comprises:

setting said reference current to a current which exceeds a maximum current in an adjustable current range based on said second trimming data before said applying said read voltage.

12. An operation method of a nonvolatile semiconductor memory device, which comprises a cell array containing a plurality of nonvolatile memory cells, a sense amplifier configured to read a data from a selected memory cell selected from said plurality of nonvolatile memory cells based on a cell current and a reference current, wherein said cell cm-rent flows through a bit line connected with said selected memory cell and said selected memory cell based on said read voltage applied to said word line which connected with said selected memory cell, and a read voltage generating circuit configured to generate said read voltage, said operation method comprising:

generating a first read voltage such that said cell current becomes larger than in the read operation from said selected memory cell, in which said trimming data is not stored, from said plurality of nonvolatile memory cells, when said read voltage generating circuit reads said trimming data from said selected memory cells, in which said trimming data are stored, from said plurality of nonvolatile memory cells; and said sense amplifier reading said trimming data from said selected memory cells based on said cell current and said the reference current, by using said first read voltage which exceeds a maximum voltage.

13. The operation method according to claim 12, wherein said generating a first read voltage comprises:

said voltage generating circuit setting said first read voltage to a voltage higher than a second read voltage used to read other data when said selected memory cell is in a first state as a relatively low threshold voltage state, if a difference between said cell current and said reference current is less than a first current as a lower limit current which can be read by said sense amplifier, in the read operation of said trimming data.

14. The operation method according to claim 12, wherein said generating a first read voltage is executed in a reset sequence.

15. The nonvolatile semiconductor memory device according to claim 3, further comprising:
- a sense amplifier configured to read a data based on a cell current which flows through said nonvolatile semiconductor memory cell and a reference current,
- wherein a second trimming data to adjust said reference current is stored in said trimming data storage area,
- said reference current is set to a current which exceeds a maximum current in an adjustable current range based on said second trimming data when said read operation is carried out to said trimming data storage area.

16. The operation method according to claim 13, wherein said generating a first read voltage is executed in a reset sequence.

* * * * *